United States Patent
Oikawa et al.

(10) Patent No.: US 11,922,987 B2
(45) Date of Patent: Mar. 5, 2024

(54) STORAGE DEVICE, ELECTRONIC COMPONENT, AND ELECTRONIC DEVICE

(71) Applicant: SEMICONDUCTOR ENERGY LABORATORY CO., LTD., Atsugi (JP)

(72) Inventors: Yoshiaki Oikawa, Kanagawa (JP); Atsushi Miyaguchi, Kanagawa (JP); Hideki Uochi, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 18/081,109

(22) Filed: Dec. 14, 2022

(65) Prior Publication Data

US 2023/0112113 A1 Apr. 13, 2023

Related U.S. Application Data

(63) Continuation of application No. 17/326,441, filed on May 21, 2021, now Pat. No. 11,532,340, which is a
(Continued)

(30) Foreign Application Priority Data

Oct. 13, 2017 (JP) ................................. 2017-199164

(51) Int. Cl.
*G11C 11/16* (2006.01)
*G11C 11/419* (2006.01)
(Continued)

(52) U.S. Cl.
CPC ........ *G11C 11/161* (2013.01); *G11C 11/1655* (2013.01); *G11C 11/1673* (2013.01);
(Continued)

(58) Field of Classification Search
CPC .............. G11C 11/161; G11C 11/1655; G11C 11/1673; G11C 11/419; G11C 11/1659;
(Continued)

(56) References Cited

U.S. PATENT DOCUMENTS 6,438,042 B1 8/2002 Kang et al.
7,205,598 B2 4/2007 Voshell et al.
(Continued)

FOREIGN PATENT DOCUMENTS

JP 2006-185477 A 7/2006
JP 2006-186109 A 7/2006
(Continued)

OTHER PUBLICATIONS

International Search Report (Application No. PCT/IB2018/057627) dated Dec. 18, 2018.
(Continued)

*Primary Examiner* — Michael T Tran
(74) *Attorney, Agent, or Firm* — Fish & Richardson P.C.

(57) ABSTRACT

A novel storage device is provided. The storage device includes a first wiring, a second wiring, and a first memory cell. The first memory cell includes a first transistor and a first magnetic tunnel junction device. One of a source or a drain of the first transistor is electrically connected to a first wiring. The other of the source or the drain of the first transistor is electrically connected to one terminal of the first magnetic tunnel junction device. Another terminal of the first magnetic tunnel junction device is electrically connected to the second wiring. The first transistor includes an oxide semiconductor in its channel formation region.

4 Claims, 20 Drawing Sheets

Related U.S. Application Data continuation of application No. 16/647,566, filed as application No. PCT/IB2018/057627 on Oct. 2, 2018, now Pat. No. 11,094,360.

(51) Int. Cl.
- *H01L 29/786* (2006.01)
- *H10B 61/00* (2023.01)
- *H10N 50/80* (2023.01)

(52) U.S. Cl.
CPC ........ *G11C 11/419* (2013.01); *H01L 29/7869* (2013.01); *H10B 61/22* (2023.02); *H10N 50/80* (2023.02)

(58) Field of Classification Search
CPC ............... G11C 11/1675; H01L 27/228; H01L 29/7869; H01L 43/02; H01L 27/1225; H01L 29/78648; H01L 29/78696; H01L 21/8239; H01L 27/105; H01L 29/82; H01L 43/08
USPC .................................................. 365/158, 156
See application file for complete search history.

(56) References Cited

U.S. PATENT DOCUMENTS

| | | | |
|---|---|---|---|
| 7,245,522 B2 | 7/2007 | Aoki | |
| 7,548,450 B2 | 6/2009 | Aoki | |
| 7,660,184 B2 | 2/2010 | Kobayashi | |
| 7,674,650 B2 | 3/2010 | Akimoto et al. | |
| 7,692,986 B2 | 4/2010 | Kajigaya | |
| 7,760,567 B2 | 7/2010 | Kobayashi | |
| 7,791,941 B2 | 9/2010 | Hanafi | |
| 8,045,360 B2 | 10/2011 | Kajigaya | |
| 8,116,112 B2 | 2/2012 | Miyakawa et al. | |
| 8,199,550 B2 | 6/2012 | Okayama | |
| 8,310,887 B2 | 11/2012 | Kajigaya | |
| 8,391,041 B2 | 3/2013 | Okayama | |
| 8,462,573 B2 | 6/2013 | Choi | |
| 8,472,273 B2 | 6/2013 | Takayama et al. | |
| 8,780,664 B2 | 7/2014 | Choi | |
| 8,829,580 B2* | 9/2014 | Sugiura .................. H10N 50/10 365/158 | |
| 8,964,478 B2 | 2/2015 | Takayama et al. | |
| 9,103,724 B2 | 8/2015 | Aoki et al. | |
| 9,378,781 B1 | 6/2016 | Jung et al. | |
| 9,542,977 B2 | 1/2017 | Onuki et al. | |
| 9,607,991 B2 | 3/2017 | Aoki | |
| 9,627,034 B2 | 4/2017 | Matsuzaki | |
| 9,640,256 B1 | 5/2017 | Roy et al. | |
| 9,704,562 B2 | 7/2017 | Onuki et al. | |
| 9,728,259 B1 | 8/2017 | Jung et al. | |
| 9,734,880 B1 | 8/2017 | Augustine et al. | |
| 9,848,149 B2 | 12/2017 | Aoki et al. | |
| 9,869,716 B2 | 1/2018 | Kurokawa | |
| 9,870,811 B2 | 1/2018 | Wang et al. | |
| 10,019,025 B2 | 7/2018 | Yamazaki | |
| 10,032,492 B2 | 7/2018 | Onuki | |
| 10,055,232 B2 | 8/2018 | Kurokawa | |
| 10,102,895 B1 | 10/2018 | Li et al. | |
| 10,192,871 B2 | 1/2019 | Onuki et al. | |
| 10,236,884 B2 | 3/2019 | Ishizu et al. | |
| 10,304,523 B2 | 5/2019 | Kato et al. | |
| 11,094,360 B2 | 8/2021 | Oikawa et al. | |
| 2002/0089024 A1* | 7/2002 | Iwata .................. B82Y 10/00 257/421 | |
| 2002/0093032 A1 | 7/2002 | Hanzawa et al. | |
| 2002/0140016 A1 | 10/2002 | Cha | |
| 2005/0122769 A1* | 6/2005 | Miyatake ........... G11C 14/0081 365/158 | |
| 2007/0070689 A1* | 3/2007 | Ikegawa ............... G11C 11/161 365/171 | |
| 2007/0153600 A1 | 7/2007 | Yuan et al. | |
| 2008/0002481 A1* | 1/2008 | Gogl ...................... G11C 7/067 327/51 | |
| 2009/0147596 A1 | 6/2009 | Shiah | |
| 2010/0008134 A1 | 1/2010 | Chen et al. | |
| 2010/0054064 A1 | 3/2010 | Miyakawa et al. | |
| 2010/0073992 A1 | 3/2010 | Ueda | |
| 2010/0157664 A1* | 6/2010 | Chung ................ G11C 11/1693 365/158 | |
| 2011/0292709 A1 | 12/2011 | Takayama et al. | |
| 2012/0008380 A1 | 1/2012 | El baraji et al. | |
| 2012/0020159 A1 | 1/2012 | Ong | |
| 2012/0026818 A1 | 2/2012 | Chen et al. | |
| 2012/0132791 A1 | 5/2012 | Aoki et al. | |
| 2012/0257448 A1 | 10/2012 | Ong | |
| 2013/0009150 A1 | 1/2013 | Inoue et al. | |
| 2013/0015541 A1* | 1/2013 | Kanaya .................. H10N 50/01 257/E29.323 | |
| 2013/0028012 A1 | 1/2013 | Fujita et al. | |
| 2013/0161771 A1 | 6/2013 | Lee et al. | |
| 2014/0153325 A1 | 6/2014 | Wang et al. | |
| 2014/0269033 A1* | 9/2014 | Natori .................... H10B 61/22 365/158 | |
| 2014/0284737 A1* | 9/2014 | Kumura ................. H10B 61/22 257/421 | |
| 2014/0347919 A1 | 11/2014 | Aoki | |
| 2015/0069480 A1* | 3/2015 | Kanaya ................. H10B 61/22 257/295 | |
| 2015/0123223 A1 | 5/2015 | Kim et al. | |
| 2015/0194209 A1 | 7/2015 | Wu et al. | |
| 2015/0227379 A1 | 8/2015 | Kurokawa | |
| 2015/0249800 A1 | 9/2015 | Aoki et al. | |
| 2015/0355272 A1* | 12/2015 | Mani .................... G11C 11/1677 324/691 | |
| 2015/0357376 A1* | 12/2015 | Seo ...................... G11C 11/1673 257/421 | |
| 2015/0364178 A1 | 12/2015 | Kim et al. | |
| 2016/0093352 A1* | 3/2016 | Jung ..................... G11C 29/021 365/158 | |
| 2016/0203865 A1* | 7/2016 | Manipatruni ........ G11C 11/1653 365/158 | |
| 2016/0224082 A1 | 8/2016 | Ohsawa et al. | |
| 2016/0267002 A1* | 9/2016 | Kanno .................. G06F 3/0616 | |
| 2016/0300614 A1 | 10/2016 | Nebashi et al. | |
| 2016/0329100 A1 | 11/2016 | Javerliac et al. | |
| 2017/0033109 A1 | 2/2017 | Yamazaki | |
| 2017/0062032 A1* | 3/2017 | Seo ............................. G11C 7/14 | |
| 2017/0077177 A1* | 3/2017 | Shimomura ............ H10B 43/27 | |
| 2017/0084322 A1 | 3/2017 | Wang et al. | |
| 2017/0117028 A1 | 4/2017 | Morton et al. | |
| 2018/0068704 A1 | 3/2018 | Shimizu | |
| 2018/0075895 A1 | 3/2018 | Kishi et al. | |
| 2018/0075897 A1 | 3/2018 | Shimizu | |
| 2018/0090498 A1* | 3/2018 | Onuki .................. H01L 27/1207 | |
| 2018/0122467 A1 | 5/2018 | Pyo et al. | |
| 2018/0122825 A1 | 5/2018 | Lupino et al. | |
| 2018/0277188 A1* | 9/2018 | Fujino ................. G11C 11/1655 | |
| 2018/0358542 A1* | 12/2018 | Mihajlovic .......... G11C 11/1673 | |
| 2019/0043565 A1 | 2/2019 | Miccoli et al. | |
| 2019/0043594 A1 | 2/2019 | Zhao et al. | |
| 2019/0348986 A1 | 11/2019 | Kay et al. | |
| 2019/0385647 A1* | 12/2019 | Higo ................... G11C 11/5607 | |
| 2020/0185023 A1 | 6/2020 | Onuki et al. | |
| 2020/0217907 A1 | 7/2020 | Raberg et al. | |
| 2020/0279595 A1* | 9/2020 | Oikawa ................. G11C 11/419 | |
| 2021/0057010 A1 | 2/2021 | Higo et al. | |
| 2021/0083001 A1 | 3/2021 | Yoshimizu | |
| 2021/0083175 A1 | 3/2021 | Suda et al. | |
| 2021/0091304 A1 | 3/2021 | Endoh et al. | |
| 2021/0098041 A1 | 4/2021 | Kim et al. | |
| 2021/0158846 A1 | 5/2021 | Onuki et al. | |
| 2022/0036928 A1 | 2/2022 | Onuki et al. | |
| 2022/0051710 A1 | 2/2022 | Kim | |

FOREIGN PATENT DOCUMENTS

| | | | |
|---|---|---|---|
| JP | 2009-164319 A | 7/2009 | |
| JP | 2010-118542 A | 5/2010 | |
| JP | 2012-123875 A | 6/2012 | |

(56) References Cited

FOREIGN PATENT DOCUMENTS

| | | |
|---|---|---|
| JP | 2012-257191 A | 12/2012 |
| JP | 2013-016746 A | 1/2013 |
| JP | 2013-242960 A | 12/2013 |
| JP | 2015-165388 A | 9/2015 |
| JP | 2015-228493 A | 12/2015 |
| JP | 2016-136737 A | 7/2016 |
| JP | 2017-208844 A | 11/2017 |
| WO | WO-2012/073797 | 6/2012 |
| WO | WO-2014148587 A1 * | 9/2014 ......... H01F 10/3254 |
| WO | WO-2015/041305 | 3/2015 |
| WO | WO-2015136725 A1 * | 9/2015 ........... H01L 27/228 |
| WO | WO-2019/048967 | 3/2019 |

OTHER PUBLICATIONS

Written Opinion (Application No. PCT/IB2018/057627) dated Dec. 18, 2018.

* cited by examiner

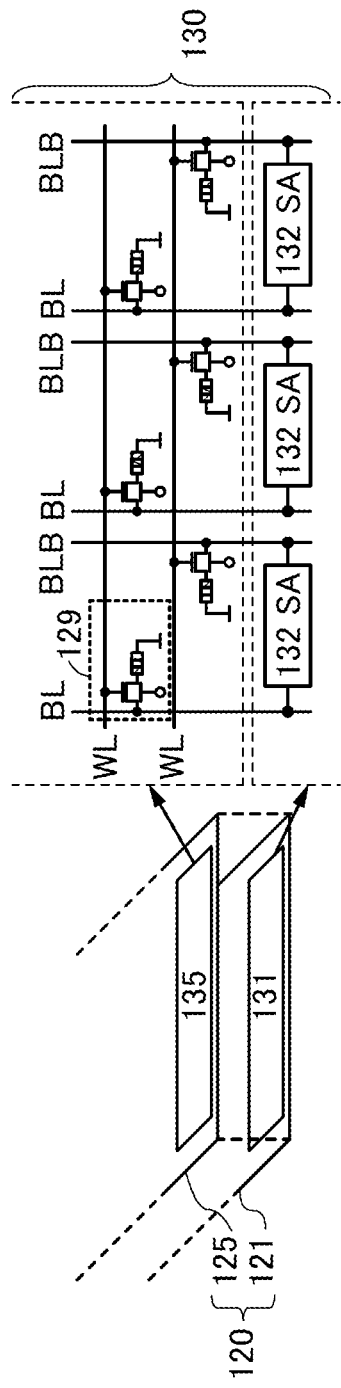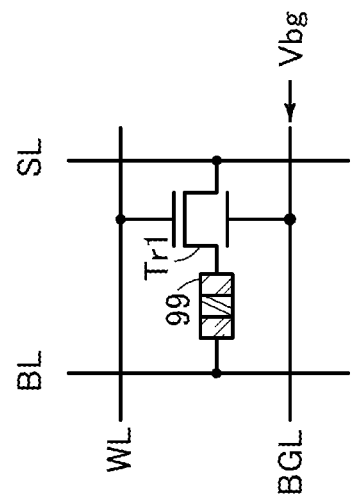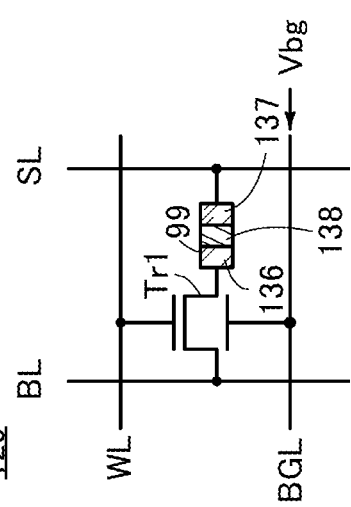
FIG. 2A
FIG. 2B
FIG. 2C

STORAGE DEVICE, ELECTRONIC COMPONENT, AND ELECTRONIC DEVICE

CROSS-REFERENCE TO RELATED APPLICATIONS

This application is a continuation of U.S. application Ser. No. 17/326,441, filed May 21, 2021, now U.S. Pat. No. 11,532,340, which is incorporated by reference and is a continuation of U.S. application Ser. No. 16/647,566, filed Mar. 16, 2020, now U.S. Pat. No. 11,094,360, which is incorporated by reference and is a U.S. National Phase Application under 35 U.S.C. § 371 of International Application PCT/IB2018/057627, filed on Oct. 2, 2018, which is incorporated by reference and claims the benefit of a foreign priority application filed in Japan on Oct. 13, 2017, as Application No. 2017-199164.

TECHNICAL FIELD

One embodiment of the present invention relates to a storage device, an electronic component, or an electronic device using the storage device and the electronic component.

BACKGROUND ART

In order to increase the performance of a large-scale integration circuit (also referred to as an LSI) such as a processor, it is necessary to increase the performance of transistors, which are components of the LSI. The improvement in device performance of transistors has progressed through scaling down. However, the leakage current of transistors increases with scaling down and the increase in power consumption is becoming a problem.

As a measure against the increase in power consumption, a measure of blocking power supply to a circuit during the period which the circuit is not in operation (power gating) is effective. For example, Patent Document 1 discloses a structure in which power supply to a memory cell array is controlled by using an STT-MRAM (Spin Transfer Torque-Magnetoresistive Random Access Memory), which is a memory that employs a resistance-change memory device called a magnetic tunnel junction (hereinafter referred to as MTJ) device.

REFERENCES

Patent Document

[Patent Document 1] International Publication No. WO2015/041305

SUMMARY OF THE INVENTION

Problems to be Solved by the Invention

The current required for rewriting data in the MTJ device may be insufficient due to the scaling down of transistors. Making the channel width (W-width) of the transistor larger and increasing the amount of current flowing in the MTJ device are effective countermeasures to the lack of current required for rewriting data. However, when the W-width direction is enlarged, the leakage current may increase.

In order to reduce the amount of current required for rewriting data, scaling down of the MTJ device is effective. However, with a structure of having to further scale down the MTJ device while increasing the W-width of the transistor within a limited cell area, a balance cannot be achieved when designing the layout of the device, which may make high integration more difficult.

An object of one embodiment of the present invention is to provide a storage device or the like which can increase the amount of current required for rewriting when the layout is designed with highly integrated MTJ device and transistor. Another object of one embodiment of the present invention is to provide a storage device or the like which can reduce the leakage current in a structure in which the layout is designed with highly integrated MTJ device and transistor. Another object of one embodiment of the present invention is to provide a storage device or the like which can inhibit the variation in the electrical performance of the device in a structure in which the layout is designed with highly integrated MTJ device and transistor. Another object of one embodiment of the present invention is to provide a storage device or the like with low power consumption. Another object of one embodiment of the present invention is to provide a novel storage device or the like.

Means for Solving the Problems

One embodiment of the present invention is a storage device having a first wiring, a second wiring, and a first memory cell. The first memory cell includes a first transistor and a first magnetic tunnel junction device. One of a source or a drain of the first transistor is electrically connected to the first wiring, and the other of the source or the drain of the first transistor is electrically connected to one terminal of the first magnetic tunnel junction device. Another terminal of the first magnetic tunnel junction device is electrically connected to the second wiring. The first transistor includes an oxide semiconductor in its channel formation region.

One embodiment of the present invention is a storage device having a first wiring, a second wiring, a first memory cell, and a sense amplifier circuit. The first memory cell includes a first transistor and a first magnetic tunnel junction device. One of a source or a drain of the first transistor is electrically connected to the first wiring, and the other of the source or the drain of the first transistor is electrically connected to one terminal of the first magnetic tunnel junction device. Another terminal of the first magnetic tunnel junction device is electrically connected to the second wiring. The first transistor includes an oxide semiconductor in its channel formation region. The sense amplifier circuit includes a second transistor constituting a CMOS-type SRAM cell. The sense amplifier circuit is electrically connected to the first wiring or the second wiring. The second transistor includes silicon in its channel formation region.

In one embodiment of the present invention, the storage device preferably includes a precharge circuit. The precharge circuit includes a third transistor having a function of precharging the first wiring, and the third transistor includes silicon in its channel formation region.

In one embodiment of the present invention, the storage device preferably includes the first magnetic tunnel junction device having a stacked-layer structure of an unfixed layer, an insulating layer, and a fixed layer.

In one embodiment of the present invention, the storage device preferably includes the first transistor having a back gate electrode.

In one embodiment of the present invention, the storage device preferably includes a second memory cell, and the second memory cell includes a fourth transistor and a second magnetic tunnel junction device. The fourth transistor includes an oxide semiconductor in its channel formation region. The first transistor and the fourth transistor are provided in different layers, and the first magnetic tunnel junction device and the second magnetic tunnel junction device are provided in the same layer.

Note that other embodiments of the present invention will be shown in the description of the following embodiments and the drawings.

Effect of the Invention

According to one embodiment of the present invention, a storage device or the like which can increase the amount of current required for rewriting when the layout is designed with highly integrated MTJ device and transistor can be provided. According to one embodiment of the present invention, a storage device or the like which can reduce the leakage current in a structure in which the layout is designed with highly integrated MTJ device and transistor can be provided. According to one embodiment of the present invention, a storage device or the like which can inhibit the variation in the electrical performance of the device in a structure in which the layout is designed with highly integrated MTJ device and transistor can be provided. According to one embodiment of the present invention, a storage device or the like with low power consumption can be provided. According to one embodiment of the present invention, a novel storage device or the like can be provided.

BRIEF DESCRIPTION OF THE DRAWINGS

FIGS. 2A to 2C Circuit diagrams for describing a structure example of a storage device.

MODE FOR CARRYING OUT THE INVENTION

Figure 1:
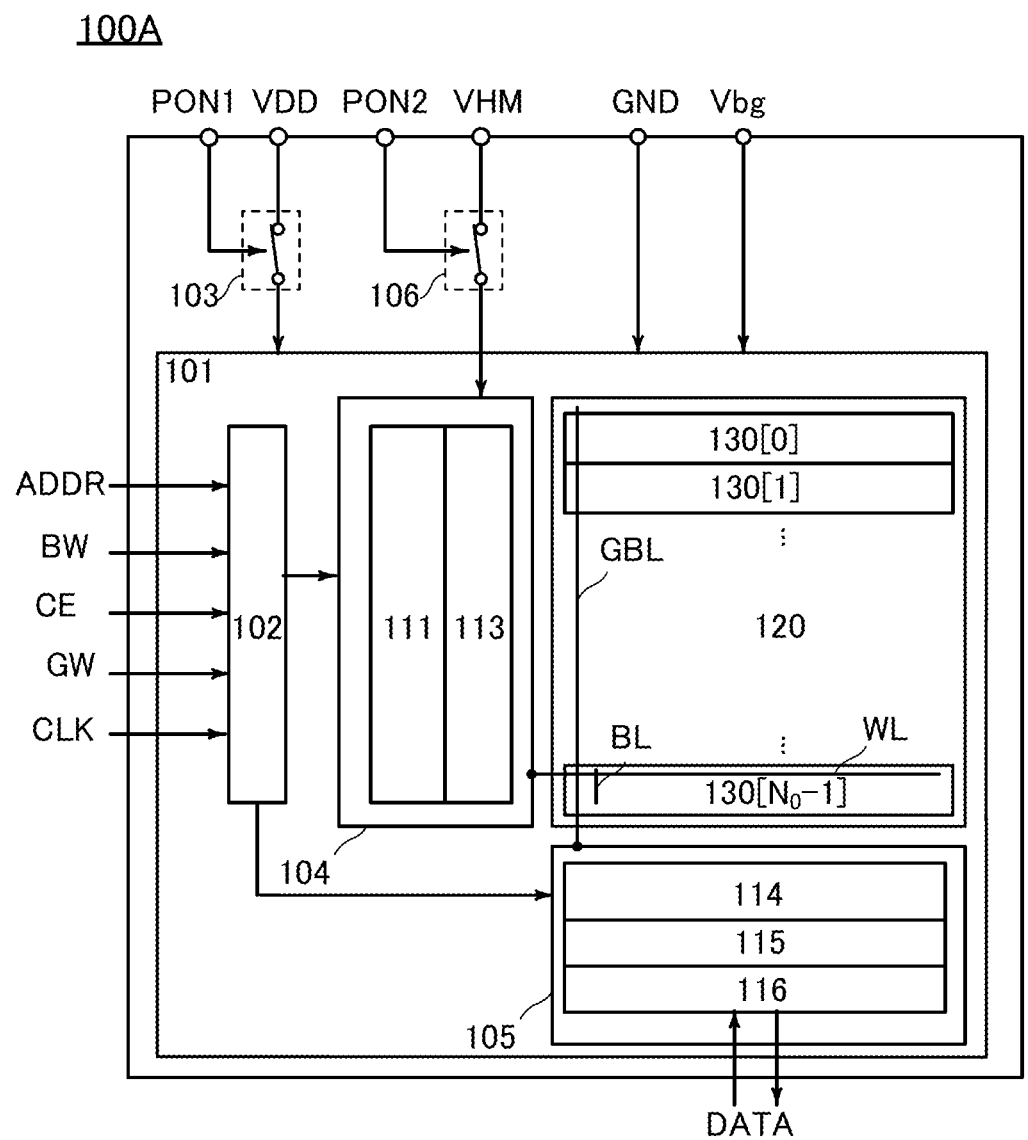
FIG. 1 A block diagram for describing a structure example of a storage device.

Hereinafter, embodiments will be described with reference to drawings. The embodiments can be implemented with many different modes, and it will be readily appreciated by those skilled in the art that modes and the details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In this specification, the embodiments described below can be combined as appropriate. In the case where a plurality of structure examples are described in one embodiment, the structure examples can be combined with each other as appropriate.

Note that in each drawing described in this specification, the size, the layer thickness, or the region of each component is exaggerated for clarity in some cases. Therefore, they are not necessarily limited to the illustrated scale.

Note that in this specification, a high power supply voltage and a low power supply voltage are sometimes referred to as an H level (or VDD) and an L level (or GND), respectively.

In this specification, in the case where brackets of an array are omitted, one of the unspecified array elements is represented. For example, a memory cell 2a represents one of the unspecified memory cells in memory cells 2a[0] to [3].

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in a semiconductor layer of a transistor, the metal oxide is referred to as an oxide semiconductor in some cases. In the case where an OS transistor is mentioned, the OS transistor can also be called a transistor including a metal oxide or an oxide semiconductor. In this specification and the like, a metal oxide containing nitrogen is also called a metal oxide in some cases.

Embodiment 1

In this embodiment, a structure of a storage device using an OS transistor and an MTJ device of one embodiment of the present invention will be described.

In this embodiment, a structure example of a storage device including a memory cell, which is a 1T-1MTJ (1 transistor 1 magnetic tunnel junction device) cell, will be described. Note that an access transistor (a transistor which controls data writing or reading) included in a memory cell is an OS transistor.

FIG. 1 is a block diagram of a storage device including a 1T-1MTJ memory cell. A storage device 100A illustrated in FIG. 1 includes a circuit block 101 and power switches (PSW) 103 and 106. The circuit block 101 includes a control circuit 102, a row circuit 104, a column circuit 105, a memory cell, and a sense amplifier array 120 (referred to as an MCSA array 120). The row circuit 104 includes a row decoder 111 and a row driver 113. The column circuit 105 includes a column decoder 114, a column driver 115, and an input/output circuit 116.

Voltages VDD, VHM (>VDD), GND, Vbg, a clock signal CLK, an address signal ADDR, signals CE, GW, and BW, and a signal DATA are input to the storage device 100A. In the storage device 100A, the circuits, signals, and voltages can be appropriately selected. Alternatively, another circuit or another signal may be added. Structures (e.g., bit lengths) of an input signal and an output signal of the storage device 100A are configured on the basis of the operation and the circuit structure of the storage device 100A.

The control circuit 102 is a logic circuit having a function of controlling the overall operation of the storage device 100A. The control circuit 102 has a function of performing logic operation on the signals CE, GW, and BW to determine the operation of the storage device 100A. The control circuit 102 also has a function of generating control signals for the row circuit 104 and the column circuit 105 so that the determined operation is executed. Note that the signals CE, GW, and BW are a chip enable signal, a global write enable signal, and a byte write enable signal, respectively. The signal DATA is a write data or a read data.

The storage device 100A has a hierarchical bit line structure. The MCSA array 120 includes a plurality of blocks 130 and a plurality of wirings GBL. The blocks 130 include a plurality of memory cells, a plurality of wirings BL, and a plurality of wirings WL. Here, the number of blocks 130 is $N_0$ ($N_0$ is an integer of 1 or greater). Note that when one of the blocks 130 needs to be specified, a reference numeral 130[0] or the like is used, and the reference numeral 130 is used to denote an arbitrary cell block. The same can be applied to other components, and a reference numeral such as [1] is used to distinguish a plurality of components.

The PSW 103 has a function of controlling the supply of the voltage VDD to the circuit block 101. The PSW 106 has a function of controlling the supply of the voltage VHM to the row circuit 104. In the storage device 100A, a high power supply voltage is the voltage VDD and a low power supply voltage is GND (a ground potential). The voltage VHM is a high power supply voltage used for setting the wiring WL to a high level and is a voltage higher than the voltage VDD. The on/off state of the PSW 103 is controlled by a signal PON1. The on/off state of the PSW 106 is controlled by a signal PON2. In FIG. 1, although one power switch each is provided for controlling the voltages VDD and VHM supplied to the circuit block 101, a plurality of power switches can also be provided. In that case, a power switch may be provided for every circuit block that supplies voltage.

The structures of the MCSA array 120 and the blocks 130 are described with reference to FIG. 2(A). The MCSA array 120 has a structure in which a memory cell array 125 is stacked over a sense amplifier array 121. The sense amplifier array 121 includes No sense amplifier blocks 131. The memory cell array 125 includes No local cell arrays 135. The blocks 130 have a structure in which the local cell arrays 135 are stacked over the sense amplifier blocks 131.

The local cell arrays 135 include a plurality of memory cells 129. As illustrated in FIG. 2(B), the memory cell 129 includes a transistor Tr1 and an MTJ device 99. The transistor Tr1 is an OS transistor having a back gate. The MTJ device 99 includes an unfixed layer 136 (also referred to as a recording layer, a free layer, or a mobile layer) composed of a single layer or a stacked layer of ferromagnetic film, a fixed layer 137 (also referred to as a fixed magnetized layer, a pin layer, or a reference layer), and an insulating layer 138 (also referred to as a barrier layer, a tunnel insulating film, or a non-magnetic layer). Note that in this specification, the unfixed layer 136 and the fixed layer 137 of the MTJ device 99 are referred to as one terminal and another terminal, respectively.

The sense amplifier block 131 is provided with a plurality of sense amplifiers 132. The sense amplifiers 132 have a function of comparing the voltages of the wiring BL and a wiring BLB, and a function of amplifying a voltage difference between the wiring BL and the wiring BLB. Note that two wirings which are compared concurrently by the sense amplifiers 132 are referred to as a bit line pair. In the example of FIG. 2(A), the wiring BL and the wiring BLB serve as a bit line pair. In this specification, the bit line pair is referred to as a bit line pair (BL, BLB) in some cases.

One of a source or a drain of the transistor Tr1 is connected to the wiring BL (or BLB). A gate of the transistor Tr1 is connected to the wiring WL. The other of the source or the drain of the transistor Tr1 is connected to one terminal of the MTJ device 99. Another terminal of the MTJ device 99 is connected to a wiring SL. The back gate of the transistor Tr1 is connected to a wiring BGL. The threshold voltage of the transistor Tr1 can be changed with the voltage Vbg.

Note that the structure in FIG. 2(B) can be changed to the structure in FIG. 2(C). In the structure illustrated in FIG. 2(C), one of the source or the drain of the transistor Tr1 is connected to the wiring SL. The gate of the transistor Tr1 is connected to the wiring WL. The other of the source or the drain of the transistor Tr1 is connected to one terminal of the MTJ device 99. Another terminal of the MTJ device 99 is connected to the wiring BL (or BLB). The back gate of the transistor Tr1 is connected to the wiring BGL.

Here, the MTJ device 99 will be described with reference to FIGS. 3(A) to 3(C).

Figure 3A:
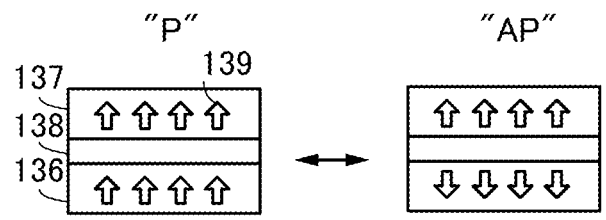
FIGS. 3A to 3C Schematic diagrams for describing a structure of a storage device.

FIG. 3(A) is a schematic diagram of a cross-sectional structure of the MTJ device 99. The MTJ device 99 is formed of the unfixed layer 136 made of a ferromagnetic material and the fixed layer 137 made of a ferromagnetic material with the insulating layer 138 interposed therebetween.

The fixed layer 137 is a layer in which a magnetization direction, i.e., a spin direction is fixed. The unfixed layer 136 is a layer in which a magnetization direction, i.e., a spin direction is not fixed. The insulating layer 138 includes magnesium oxide (MgO) or aluminum oxide ($Al_2O_3$). The unfixed layer 136 and the fixed layer 137 include a ferromagnetic material such as iron (Fe) or cobalt (Co); or an alloy thereof. The unfixed layer 136, the fixed layer 137, and the insulating layer 138 can be formed with a single layer or a plurality of layers.

The resistance of the MTJ device 99 changes depending on the relative direction of the magnetization direction of the unfixed layer 136 and the fixed layer 137 (indicated by arrow symbols 139 in FIG. 3(A)). Thus, the MTJ device 99 can be of two states depending on the magnetization direction as illustrated in FIG. 3(A). The resistance change, which depends on the magnetization direction, is referred to as tunnel magnetoresistance (hereinafter referred to as TMR). The state in which the unfixed layer 136 and the fixed layer 137 face the same magnetization direction is called a parallel state. The resistance of the MTJ device 99 in this state becomes minimum, and this state can be expressed as "P" or data "0". The state in which the unfixed layer 136 and the fixed layer 137 face the opposite magnetization direction is called an antiparallel state. The resistance of the MTJ device 99 in this state becomes maximum, and this state can be expressed as "AP" or data "1". By controlling the magnetization state of the unfixed layer 136 to be parallel or antiparallel to the fixed layer 137, the recording of "0" or "1", that is, data writing can be performed. The MTJ device 99 is a resistance-change memory device utilizing the generation of resistance change in accordance with the direction of the magnetization direction.

The MTJ device 99 is nonvolatile and capable of high-speed rewriting, and has an unlimited number of rewrites in principle. The write current of the MTJ device 99 can be reduced together with the scaling down of the device.

Next, an operation principle of the MTJ device 99 will be described. FIG. 3(B) is a diagram illustrating a principle of writing using a spin injection method to change the magnetization direction of the unfixed layer 136 and the fixed layer 137 in the MTJ device 99 from the antiparallel state to the parallel state.

Figure 3B:
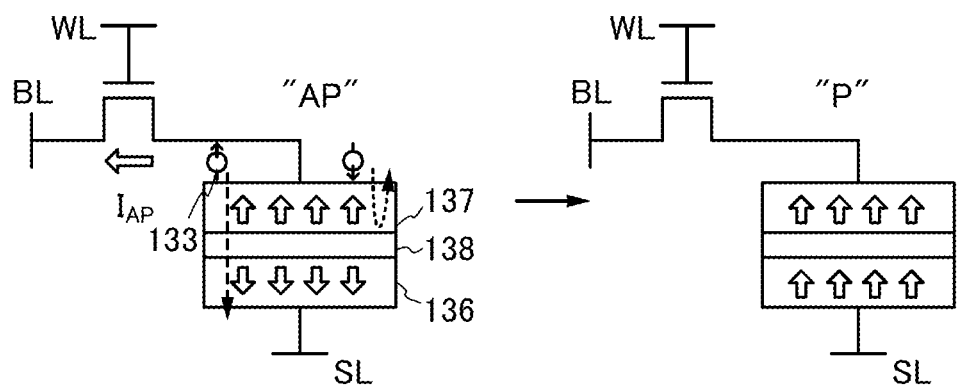

As illustrated in FIG. 3(B), in order to write from the antiparallel state ("AP") to the parallel state ("P"), a current $I_{AP}$ is applied in the direction from the unfixed layer 136 to the fixed layer 137. At this time, electrons flow in the opposite direction of the current $I_{AP}$ (refer to the dotted arrow). Accordingly, injection of a spin 133 from the fixed layer 137 to the unfixed layer 136 occurs. The current which has been polarized by spinning operates on the magnetization of the unfixed layer 136, and the magnetization of the unfixed layer 136 reverses to the same direction as the fixed layer 137 to become the parallel state. The spin 133 to be injected is illustrated by a dashed arrow.

Figure 3C:
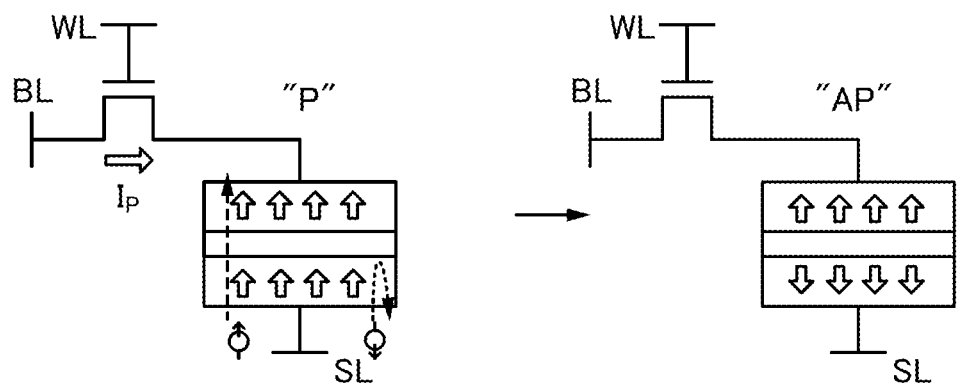

FIG. 3(C) is a diagram illustrating a principle of writing using a spin injection method to make the magnetization direction of the unfixed layer 136 and the fixed layer 137 from the parallel state to the antiparallel state in the MTJ device 99.

As illustrated in FIG. 3(C), in contrast to FIG. 3(B), in order to write from the parallel state ("P") to the antiparallel state ("AP"), a current $I_P$ is supplied in the direction from the fixed layer 137 to the unfixed layer 136. The injected spin will be canceled out by the unfixed layer 136, but the electrons reflected by the insulating layer 138 will have magnetization in the opposite direction of the unfixed layer 136. The spin which has been reflected by the insulating layer 138 reverses the magnetization of the unfixed layer 136 to become the antiparallel state. Note that the reflected spin 133 is illustrated by a dotted arrow.

The magnetization direction of the unfixed layer 136 is reversed to be the opposite of the magnetization direction of the fixed layer 137 by the direction of the current supplied to the MTJ device 99. When the magnetization directions are parallel to each other, the magnetic resistance decreases. Conversely, when the magnetization direction of the unfixed layer 136 is in the antiparallel state to the magnetization direction of the fixed layer 137, the magnetic resistance increases. Note that the unfixed layer 136 and the fixed layer 137 in the MTJ device 99 can be switched by switching the direction of current. In the MTJ device 99, the current necessary for the reversal of magnetization can be reduced by scaling down the device.

Next, an OS transistor including a metal oxide is described.

A metal oxide has a band gap of 2.5 eV or wider; thus, an OS transistor has an extremely small off-state current. For example, the off-state current per micrometer in channel width at a source—drain voltage of 3.5 V and room temperature (25° C.) can be lower than $1 \times 10^{-20}$ A, lower than $1 \times 10^{-22}$ A, or lower than $1 \times 10^{-24}$ A. Thus, in the memory cell 129, the amount of charge that leaks between the wiring BL and the wiring SL through the transistor Tr1 can be extremely small.

A metal oxide used for an OS transistor is Zn oxide, Zn—Sn oxide, Ga—Sn oxide, In—Ga oxide, In—Zn oxide, In-M-Zn oxide (M is Ti, Ga, Y, Zr, La, Ce, Nd, Sn, or Hf), or the like. In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical performance of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of disallowing electrons serving as carriers to flow. The function of allowing electrons to flow and the function of disallowing electrons to flow are separated, whereby both functions can be heightened to the maximum. In other words, when CAC-OS is used for a channel formation region of an OS transistor, a high on-state current and an extremely low off-state current can be both achieved. Thus, an OS transistor is highly suitable for the access transistor of the memory cell.

An OS transistor can be provided over an insulator. Thus, a structure in which an OS transistor is provided over an insulator, which is provided over a Si transistor, can be obtained. In other words, a structure in which a circuit composed of OS transistors is provided over a circuit composed of Si transistors can be obtained. An increase in the circuit area due to having both Si transistors and OS transistors can be suppressed. In order to suppress an increase in the circuit area, a structure in which an MTJ device is provided over the OS transistor is effective.

In an OS transistor used as an access transistor, the W-width needs to be enlarged to supply a current for writing data to an MTJ device. In the case where a Si transistor is used as an access transistor, both scaling down and increasing the write current need to be furthered. In the case of a structure in which an OS transistor is used as an access transistor, a layer including OS transistors can be provided over a layer including Si transistors, and scaling down the Si transistors and increasing the write current of the OS transistor can be separately designed by layer. Thus, within a limited cell area, scaling down the Si transistors, enlarging the W-width of the OS transistors, and scaling down the MTJ device can be realized all at one time. Accordingly, high integration and reducing power consumption can be both achieved. Furthermore, by making it possible to increase the amount of current required for rewriting the MTJ device, data can be written to and read from the MTJ device more reliably.

Furthermore, the OS transistor has a low off-state current. Thus, even in the case where a large W-width is designed to allow more current to flow through the access transistor, an increase in leakage current when the access transistor is in an off state can be inhibited. Accordingly, a storage device with lower power consumption can be achieved. Furthermore, in an OS transistor, by providing a potential to the back gate electrode, variation in electrical performance such as threshold voltage can be inhibited.

In the storage device 100A described in FIG. 1 to FIG. 3, a structure in which the transistor Tr1 included in the local cell arrays 135 is an OS transistor, and other transistors such as the transistors included in the sense amplifier block 131 are Si transistors is obtained. With this structure, a device structure in which a circuit composed of OS transistors is stacked over a circuit composed of Si transistors can be obtained. This device structure will be described with reference to FIG. 4 to FIG. 6.

Figure 4:
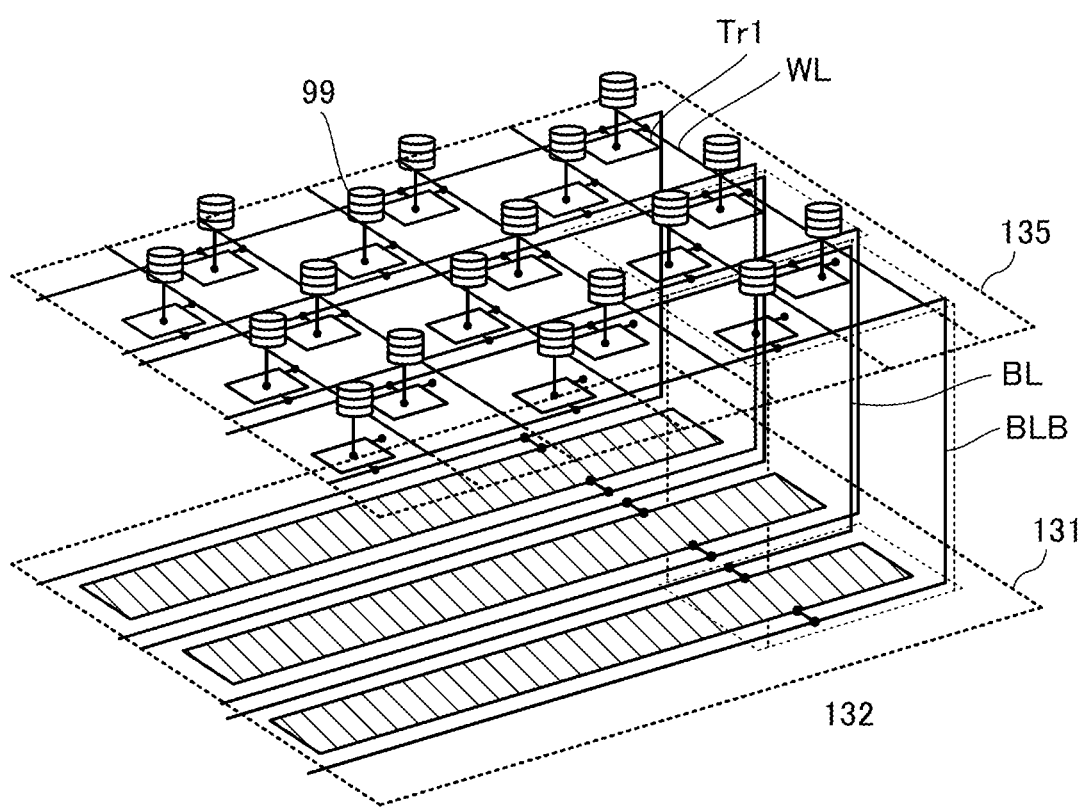
FIG. 4 A schematic diagram for describing a structure example of a storage device.

In the storage device 100A, the transistor Tr1 in the local cell array 135 can be an OS transistor, and the transistor in the sense amplifier block 131 can be a Si transistor. In that case, the MCSA array 120 can have a device structure in which a circuit composed of OS transistors is stacked over a circuit composed of Si transistors. FIG. 4 schematically illustrates a device structure example of the MCSA array 120.

In the example of FIG. 4, the local cell array 135 is stacked over the sense amplifier block 131. The sense amplifier block 131 is provided with a plurality of sense amplifiers 132. By stacking the local cell array 135 over the sense amplifier 132, high integration of the storage device 100A, that is, an increase in capacity and a reduction in size can be performed effectively.

By stacking the local cell array 135 over the sense amplifier 132, it is possible to increase the capacity and reduce the size of the storage device 100A. The area of the memory cell per bit can be reduced compared with a CMOS-type DRAM memory cell.

In addition, an OS transistor can suppress an increase in leakage current in an off state (in standby). Thus, a storage device with lower power consumption can be obtained.

In the example of FIG. 4, the MTJ device 99 provided over a layer including the transistor Tr1, i.e., an OS transistor, is illustrated. That is, the structure in FIG. 4 is a structure in which a layer including OS transistors is provided over a layer including Si transistors, and the MTJ device 99 is further provided over the layer including OS transistors. Therefore, the area of the memory cell per bit can be further reduced.

Next, modification examples of the stacked-layer structure of the memory cell included in the local cell array 135 will be described with reference to FIG. 5 to FIG. 6.

Figure 5:
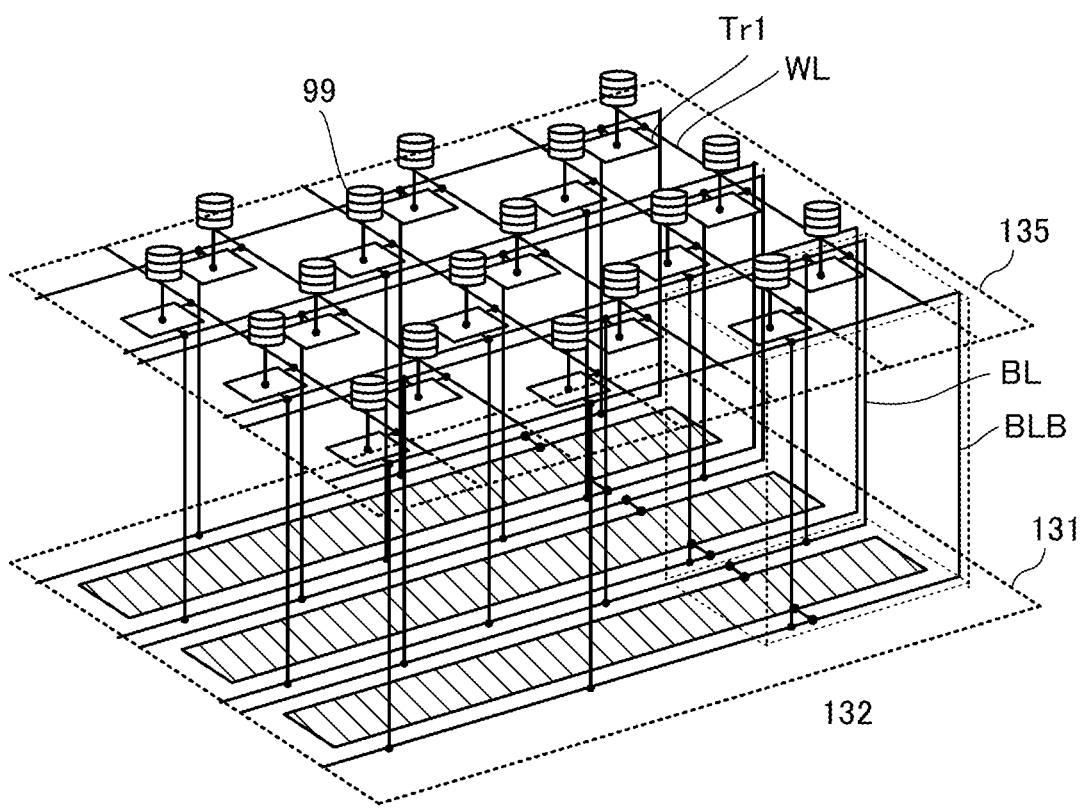
FIG. 5 A schematic diagram for describing a structure example of a storage device.

The circuit diagram illustrated in FIG. 5 includes wirings for electrically connecting the upper wirings BL and BLB between the local cell array 135 and the sense amplifier block 131. With this structure, the parasitic resistance of the wirings BL and BLB, which function as bit lines and inverted bit lines, can be reduced.

Figure 6:
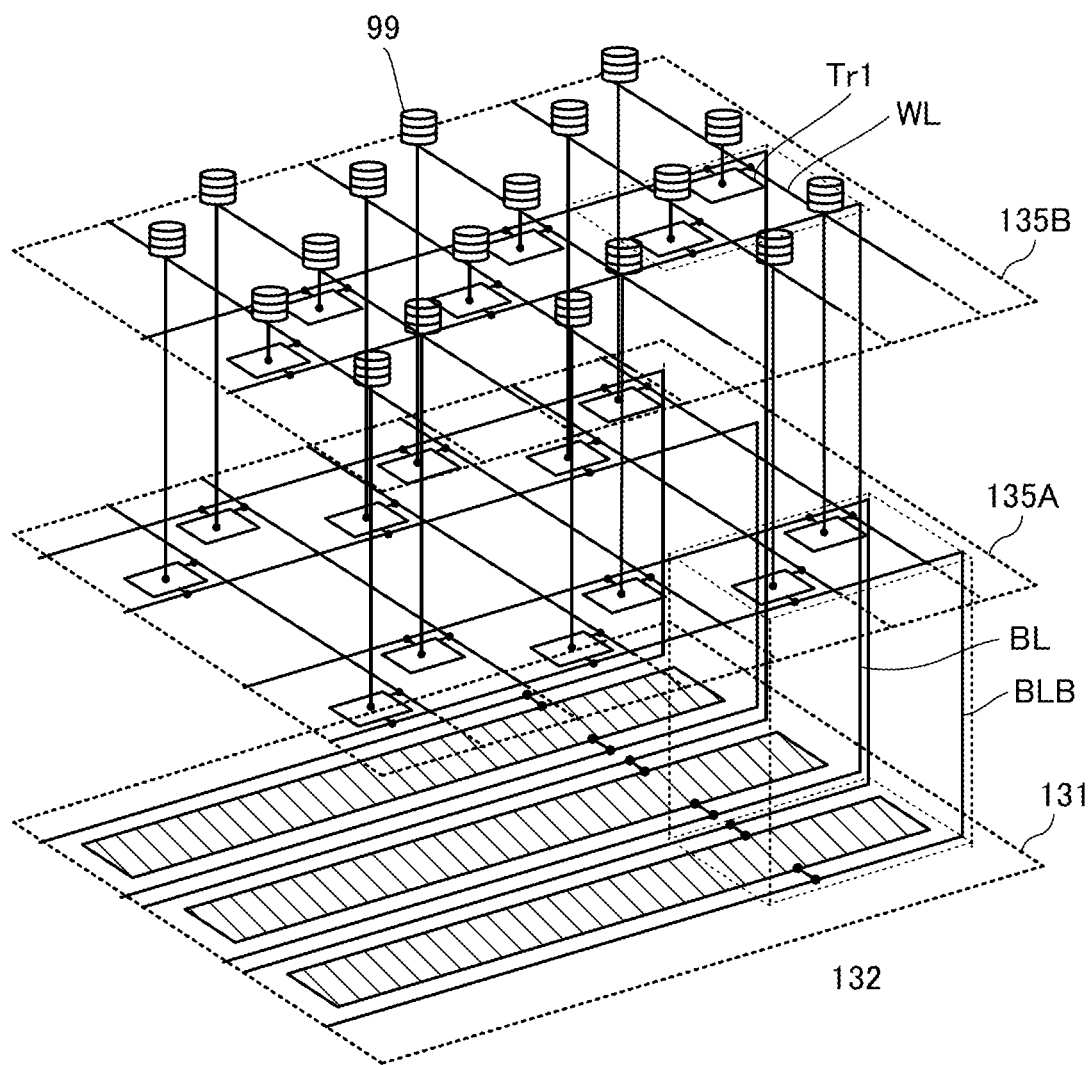
FIG. 6 A schematic diagram for describing a structure example of a storage device.

A circuit diagram illustrated in FIG. 6 is an example in which two layers, each including OS transistors, are stacked. In FIG. 6, a structure in which a local cell array 135A and a local cell array 135B are stacked as a layer including OS transistors, and the MTJ device 99 is provided thereover is illustrated. Since the OS transistors can be provided by stacking, the size of the transistor can remain the same while reducing the circuit area.

As described above, the storage device of one embodiment of the present invention can have a structure in which a circuit composed of OS transistors is provided over a circuit composed of Si transistors. An increase in the circuit area due to having both Si transistors and OS transistors can be inhibited. In addition, within a limited cell area, scaling down the Si transistors, enlarging the W-width of the OS transistors, and scaling down the MTJ device can be realized all at one time. Accordingly, high integration and reducing power consumption can be both achieved. Furthermore, the OS transistor also has a low off-state current. Thus, even in the case where a large W-width is designed to increase the current flowing through the access transistor, an increase in leakage current can be suppressed.

Embodiment 2

In this embodiment, a storage device having a structure different from that of the storage device mentioned in Embodiment 1 is described.

Figure 7:
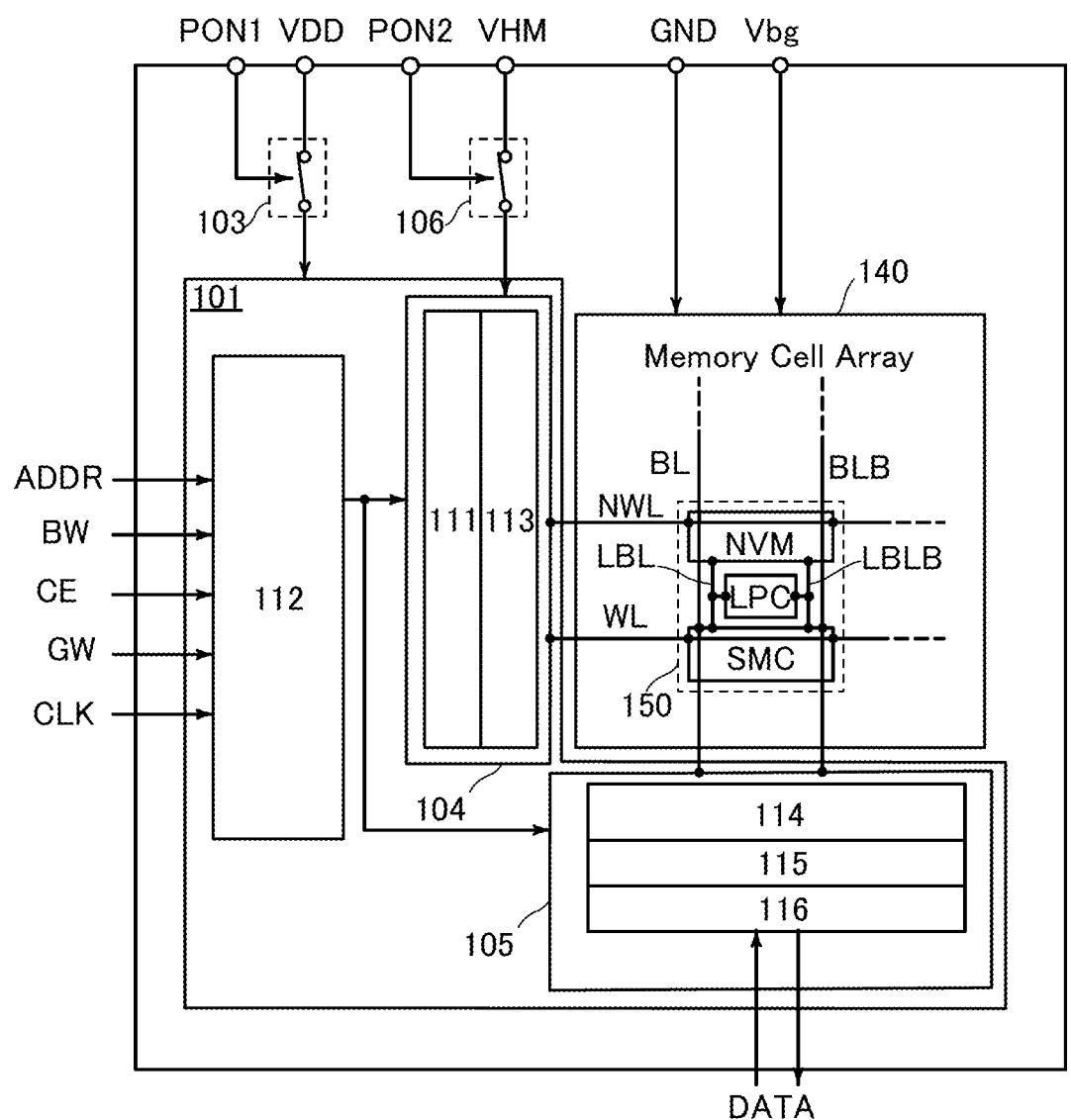
FIG. 7 A block diagram for describing a structure example of a storage device.

FIG. 7 is a block diagram illustrating a structure example of a storage device. A storage device 100B illustrated in FIG. 7 includes a memory cell array 140, the circuit block 101, and the power switches (PSW) 103 and 106. The circuit block 101 includes a control circuit 112, the row circuit 104, and the column circuit 105. The row circuit 104 includes the row decoder 111 and the row driver 113. The column circuit 105 includes the column decoder 114, the column driver 115, and the input/output circuit 116.

In the storage device 100B, each circuit, each signal, and each voltage can be appropriately selected as needed. Alternatively, another circuit or another signal may be added. Signals BW, CE, GW, CLK, ADDR, PON1, and PON2 are signals input from the outside, and the signal DATA is a data signal that is input or output. The signal CLK is a clock signal. The signals CE, GW, and BW are control signals. The signal CE is a chip enable signal, the signal GW is a global write enable signal, and the signal BW is a byte write enable signal. The signal ADDR is an address signal. The signal DATA is a write data or a read data. The signals PON1 and PON2 are power gating control signals. Note that the signals PON1 and PON2 may be generated in the control circuit 102.

The control circuit 112 is a logic circuit having a function of controlling the overall operation of the storage device 100B. For example, the control circuit performs a logical operation on the signal CE, the signal GW, and the signal BW to determine an operation mode of the storage device 100B (e.g., write operation or read operation, or the like). Alternatively, the control circuit 112 generates a control signal for inside the circuit block 101 so that the operation mode is executed.

The memory cell array 140 includes a plurality of memory cells (MC) 150 and a plurality of wirings WL, NWL, BL, and BLB. The plurality of memory cells 150 are arranged in a matrix.

The memory cells 150 in the same row are connected to the wirings WL and NWL in the row. The wirings WL and NWL are each a word line, and the wirings BL and BLB are a bit line pair for transmitting complementary data. The wiring BLB is a bit line to which data whose logic is inverted from that of the wiring BL is input, and is referred to as a complementary bit line or an inverted bit line in some cases. The memory cells 150 include two kinds of memories, a memory SMC and a memory NVM. The memory SMC is a memory circuit that can store 1-bit complementary data. The memory NVM is a memory circuit that can store n-bit (n is an integer larger than 1) complementary data, and can retain data for a long time in a power-off state.

The memory SMC and the memory NVM are connected through a local bit line pair (wirings LBL and LBLB). The wiring LBL is a local bit line with respect to the wiring BL, and the wiring LBLB is a local bit line with respect to the wiring BLB. The memory SMC and the memory NVM are electrically connected through the wirings LBL and LBLB. The memory cell 150 includes a circuit LPC. The circuit LPC is a local precharge circuit for precharging the wiring LBL and the wiring LBLB. A control signal of the circuit LPC is generated by a peripheral circuit such as the row circuit 104 or the column circuit 105.

The row circuit 104 and the column circuit 105 are circuits for performing data writing and reading for the memory cell array 140.

The row decoder 111 and the column decoder 114 have a function of decoding the signal ADDR. The row decoder 111 is a circuit for specifying a row to be accessed, and the column decoder 114 is a circuit for specifying a column to be accessed. The row driver 113 has a function of selecting the wirings WL and NWL in a row specified by the row decoder 111. Specifically, the row driver 113 has a function of generating a signal for selecting the wirings WL and NWL. The column driver 115 has a function of writing data to the memory cell array 140, reading data from the memory cell array 140, retaining the read data, precharging the wirings BL and BLB, and the like.

The input/output circuit 116 is a circuit which inputs and output data that are input to and output from the memory cell array 140 between external circuits of the storage device 100B. The input data and output data are collectively illustrated as data DATA.

The power switch 103 has a function of controlling the supply of VDD to circuits other than the memory cell array 140 (the circuit block 101). The power switch 106 has a function of controlling the supply of VHM to the row circuit 104. Here, in the storage device 100B, a high power supply voltage is VDD and a low power supply voltage is GND (a ground potential). In addition, VHM is a high power supply voltage used for setting the wiring NWL to a high level and is higher than VDD. The on/off state of the power switch 103 is controlled by the signal PON1, and the on/off state of the power switch 106 is controlled by the signal PON2. In FIG. 7, the number of power domains to which VDD is supplied is one in the circuit block 101, but the number can also be more than one. In that case, a power switch is provided for each power domain. Furthermore, the negative voltage Vbg is applied from the outside by a transistor used in the NVM.

Figure 8:
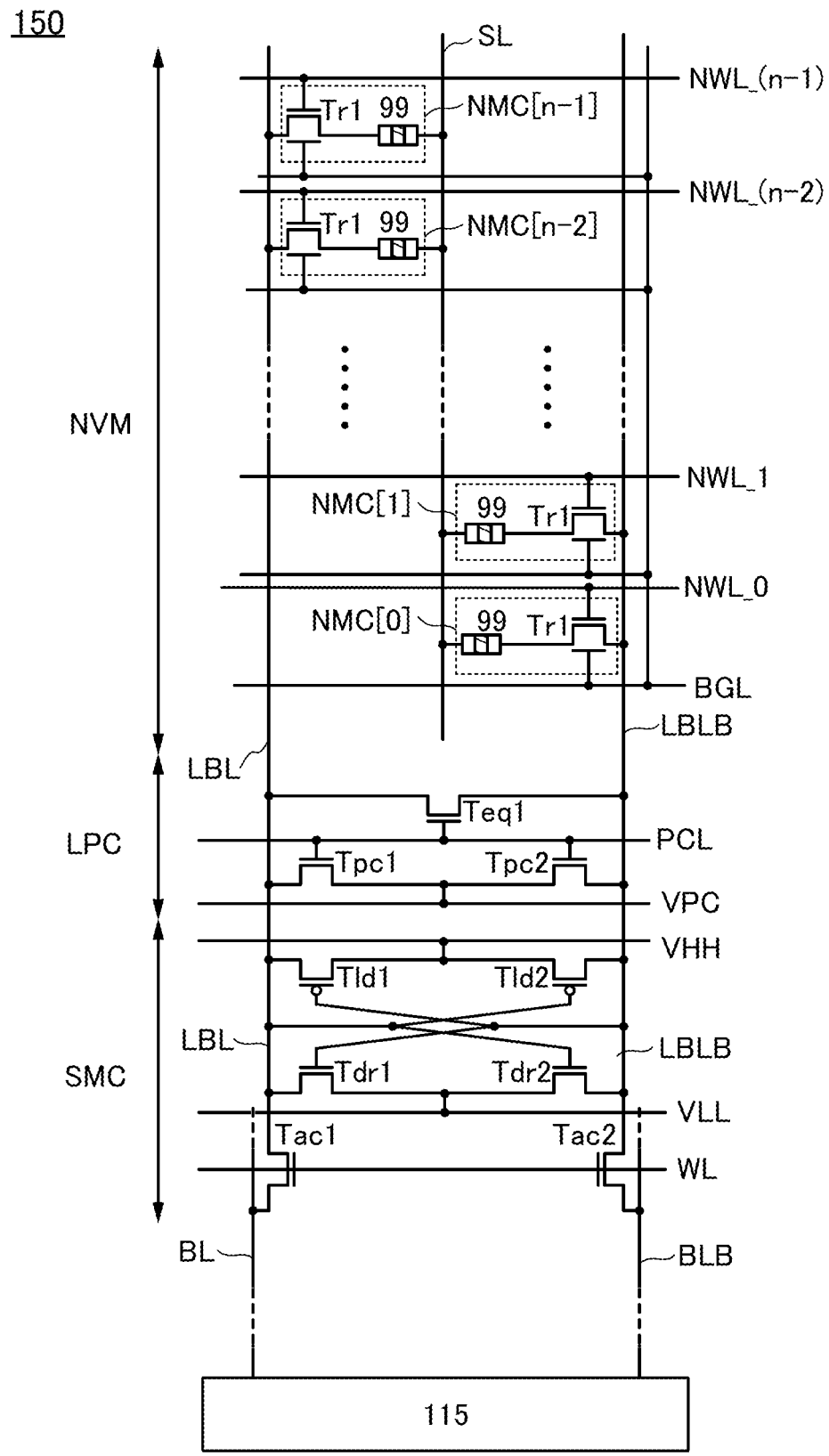
FIG. 8 A circuit diagram for describing a structure example of a storage device.

FIG. 8 illustrates a circuit structure example of the memory cell 150.

The SMC is connected to the wiring BL, the wiring BLB, the wiring LBL, the wiring LBLB, a wiring VHH, and a wiring VLL.

The SMC has a circuit structure similar to that of a CMOS-type (6-transistor type) SRAM cell, and includes transistors Tld1, Tld2, Tdr1, Tdr2, Tac1, and Tac2. The transistors Tld1 and Tld2 are load transistors (pull-up transistors), the transistors Tdr1 and Tdr2 are driving transistors (pull-down transistors), and the transistors Tac1 and Tac2 are access transistors (transfer transistors).

The conduction state between the wiring BL and the wiring LBL is controlled by the transistor Tac1. The conduction state between the wiring BLB and the wiring LBLB is controlled by the transistor Tac2. The on/off state of the transistors Tac1 and Tac2 is controlled by the potential of the wiring WL. The transistors Tld1 and Tdr1 form an inverter, and the transistors Tld2 and Tdr2 form an inverter. Input terminals of these two inverters are each connected to another output terminal, whereby a latch circuit is formed. A power supply voltage is supplied to the two inverters through the wirings VHH and VLL.

The NVM illustrated in FIG. 8 includes n (n is an even number larger than or equal to 2) memory circuits NMC. The n memory circuits NMC are connected to different wirings NWL. Furthermore, the n memory circuits NMC are connected to one wiring SL. To distinguish the n memory circuits NMC from each other, reference numerals such as [0] and [1] are used. To distinguish the n wirings NWL from each other, reference numerals such as _0 and _1 are used.

The memory circuit NMC is a memory circuit (which can also be referred to as a memory cell) that can retain 1-bit data. The memory circuit NMC has a circuit structure of a 1T-1MTJ cell described in FIG. 2. The memory circuit NMC includes the transistor Tr1 and the MTJ device 99. As described in FIG. 3, a resistance change is generated in the MTJ device 99 in accordance with the magnetization direction; hence, the MTJ device 99 functions as a resistance-change memory device. The wiring SL is a power supply line to supply current to the MTJ device 99.

One of the source or the drain of the transistor Tr1 is connected to the wiring LBL (or the wiring LBLB). A gate of the transistor Tr1 is connected to the wiring NWL. The other of the source or the drain of the transistor Tr1 is connected to one terminal of the MTJ device 99. Another terminal of the MTJ device 99 is connected to the wiring SL. The back gate of the transistor Tr1 is connected to the wiring BGL. The threshold voltage of the transistor Tr1 can be changed with the voltage Vbg. Thus, the transistor Tr1 can be prevented from becoming normally on.

Half of the memory circuit NMC[0] to the memory circuit NMC[n−1] are connected to the wiring LBL, and the other half are connected to the wiring LBLB. The NVM illustrated in FIG. 8 shows a circuit diagram in which a folded architecture is used as the layout of the memory cell. Note that a memory cell with a folded architecture will be described again in FIG. 11.

An OS transistor is preferably used as the transistor Tr1. Using the OS transistor can significantly reduce the off-state current of the transistor Tr1. When the off-state current of the transistor Tr1 is reduced, the leakage current flowing between the wiring LBL (or the wiring LBLB) and the wiring SL can be reduced. An ultralow off-state current means that, for example, off-state current per micrometer of channel width is lower than or equal to 100 zA (zeptoamperes). Note that since the off-state current is preferably as low as possible, the normalized off-state current is preferably lower than or equal to 10 zA/μm or lower than or equal to 1 zA/μm, further preferably lower than or equal to 10 yA (yoctoamperes)/μm. Note that 1 zA is $1\times10^{-21}$ A and 1 yA is $1\times10^{-24}$ A.

Note that the number of memory circuits NMC (n) is preferably a multiple of 8. That is, the number of bits of data that can be retained by the NVM is preferably a multiple of 8. When the number of memory circuits NMC is a multiple of 8, the memory cell 150 can handle data in units such as byte (8 bits), word (32 bits), or half-word (16 bits), for example.

The circuit LPC is connected to a wiring PCL and a wiring VPC. The wiring PCL is a signal line for supplying a signal for controlling the precharge operation of the wirings LBL and LBLB. The wiring VPC is a power supply line for supplying a precharge voltage. The circuit LPC includes transistors Teq1, Tpc1, and Tpc2. Gates of the transistors Teq1, Tpc1, and Tpc2 are connected to the wiring PCL. The transistor Teq1 controls the conduction state between the wirings LBL and LBLB. The transistor Tpc1 controls the conduction state between the wiring LBL and the wiring VPC. The transistor Tpc2 controls the conduction state between the wiring LBLB and the wiring VPC.

In the example of FIG. 8, the transistors Teq1, Tpc1, and Tpc2 are n-channel transistors, but they may also be p-channel transistors. Alternatively, the transistor Teq1 need not be provided in the circuit LPC. In that case, the transistors Tpc1 and Tpc2 may be either an n-channel transistor or a p-channel transistor. Alternatively, the circuit LPC can be formed with only the transistor Teq1. In that case, the transistor Teq1 may also be either an n-channel transistor or a p-channel transistor. The circuit LPC that is made of the transistor Teq1 precharges the wiring LBL and the wiring LBLB by smoothing the potentials of the wiring LBL and the wiring LBLB.

The row circuit 104 has a function of supplying potentials to each type of power supply line (the wirings VHH, VLL, and VPC) provided in the memory cell array 140. Therefore, when the power switch 103 is turned off and the supply of VDD to the circuit block 101 is stopped, the supply of potentials to these power supply lines is also stopped.

Figure 9:
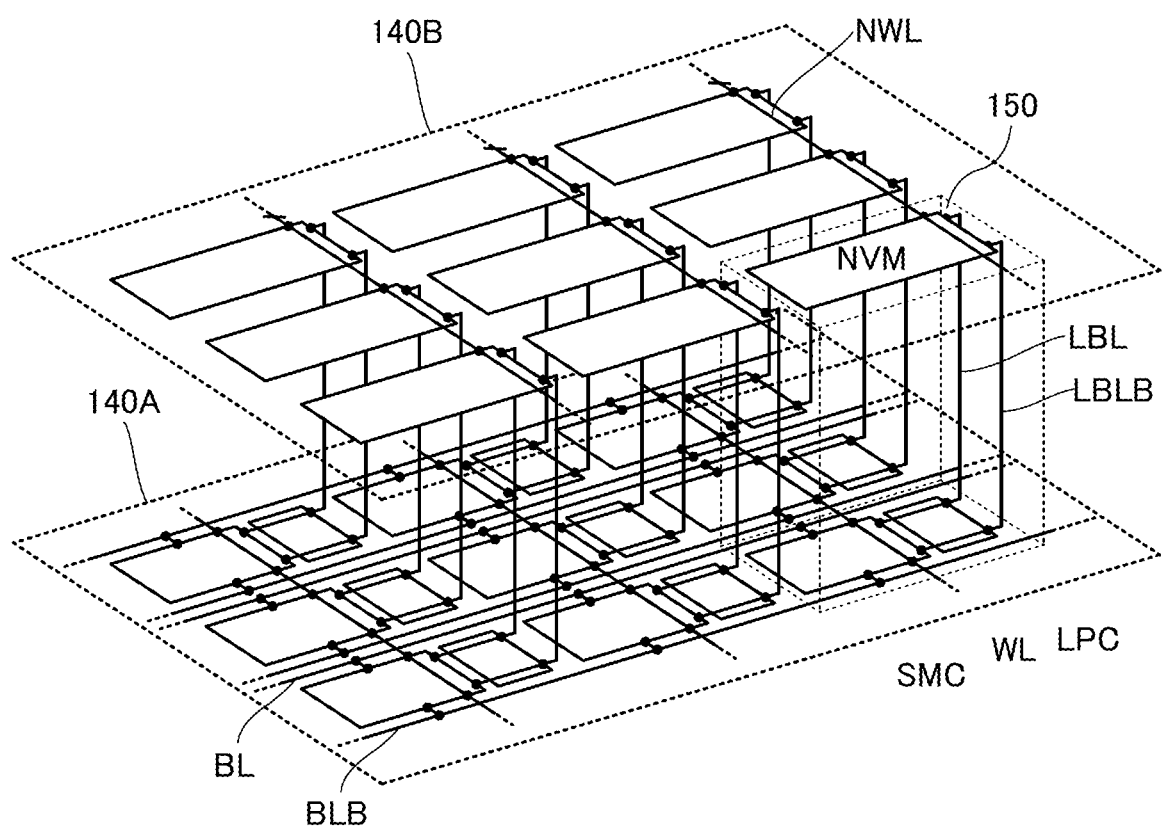
FIG. 9 A circuit diagram for describing a structure example of a storage device.

In the storage device 100B, the transistor Tr1 in the memory NVM can be an OS transistor, and the other transistors can be, for example, Si transistors or the like. In that case, the memory cell array 140 can have a device structure in which a circuit composed of OS transistors is stacked over a circuit composed of Si transistors. FIG. 9 schematically illustrates an example of a device structure of the memory cell array 140.

In the example of FIG. 9, a memory cell array 140B is stacked over a memory cell array 140A. In the memory cell array 140A, the circuit SMC and the circuit LPC are arranged in a matrix. In the memory cell array 140B, the circuit NVM is arranged in a matrix. The memory cell array 140A is formed using Si transistors, and the memory cell array 140B is formed using OS transistors. By stacking the memory cell array 140B over the memory cell array 140A, an increase in capacity and a reduction in size of the storage device 100B can be performed effectively.

Stacking the memory cell array 140B over the memory cell array 140A can increase the capacity and reduce the size of the memory cell array 140. The area per bit of the memory cell 150 can be further reduced compared with a CMOS-type SRAM memory cell.

The memory cell array 140B composed of the circuit NVM can have a structure in which a circuit formed of OS transistors is provided over the memory cell array 140A formed of Si transistors, and a MTJ device is provided thereover. The OS transistor used as an access transistor needs to have an enlarged W-width direction to supply a current for writing data to the MTJ device. Although it is necessary to further both scaling down and increase in write current to use a Si transistor as an access transistor, the scaling down and write current can be separately designed by layer. Therefore, both increasing the W-width of the transistor and scaling down the MTJ device can be achieved in a limited cell area. Consequently, high integration and lower power consumption can be both achieved.

The memory cell array 140B composed of the circuit NVM can secure a layout area in which the W-width of the transistor is increased. In other words, the current required for rewriting the MTJ device can be increased. Accordingly, data can be written to and read from the MTJ device more reliably. The MTJ device can store data even in a power-off state, hence power gating of the storage device 100B can be performed.

An SRAM is operated at high speed and therefore used in an on-chip cache memory of a standard processor. An SRAM has the following drawbacks: power is consumed even in a standby state, and it is difficult to increase the capacity. For example, it is said that, in a processor for a mobile device, power consumption of an on-chip cache memory in a standby state accounts for 80% of the average power consumption of the whole processor. In contrast, the storage device 100B is a RAM that has advantages of an SRAM, which are high-speed reading and writing, and does not have the drawbacks of an SRAM. Thus, the use of the storage device 100B in an on-chip cache memory is advantageous in reducing the power consumption of the whole processor. The area per bit of the storage device 100B is small and the capacitance can be increased easily; therefore, the storage device 100B is suitable for a cache memory or the like.

Figure 10:
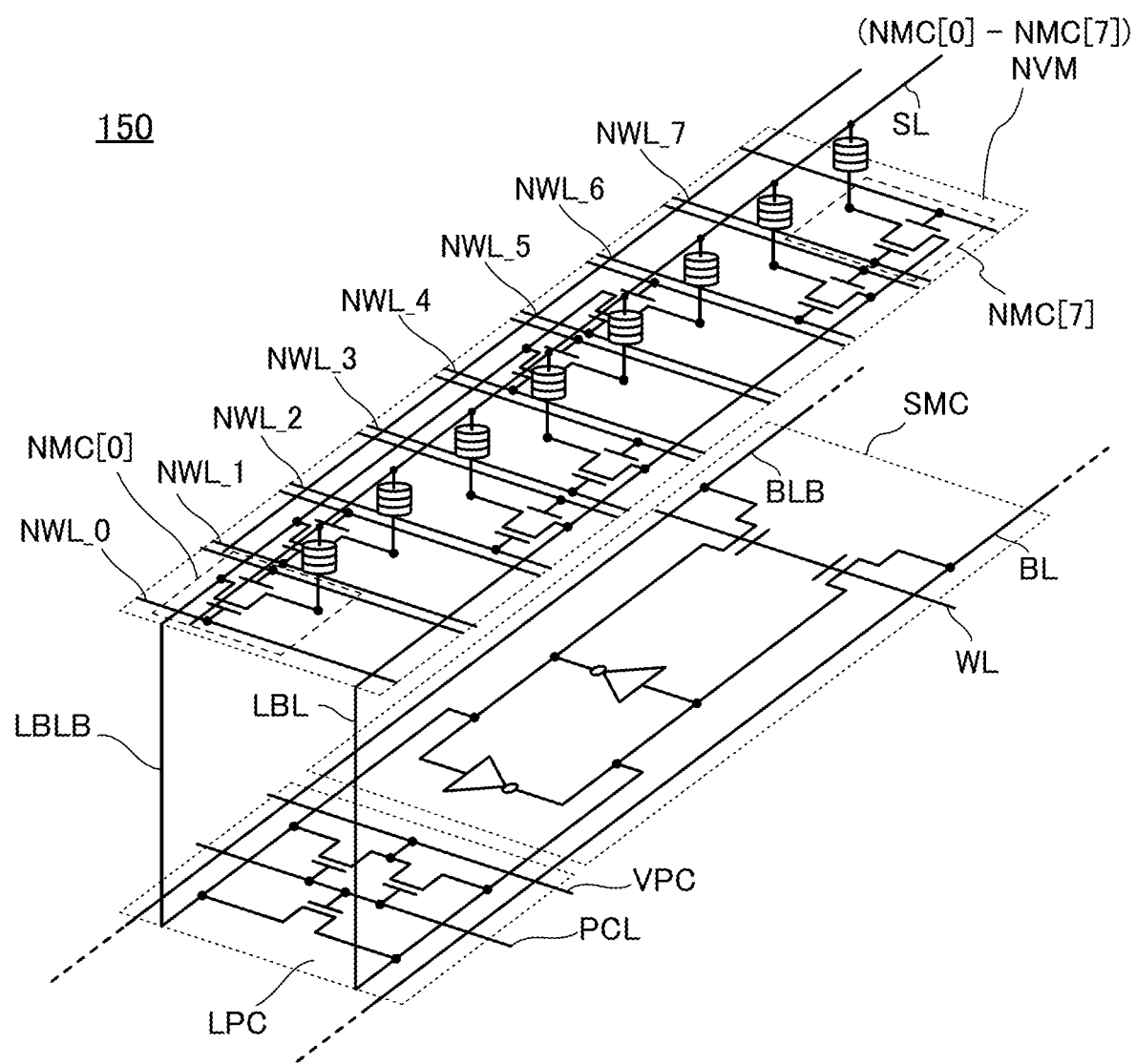
FIG. 10 A circuit diagram for describing a structure example of a storage device.
Figure 11:
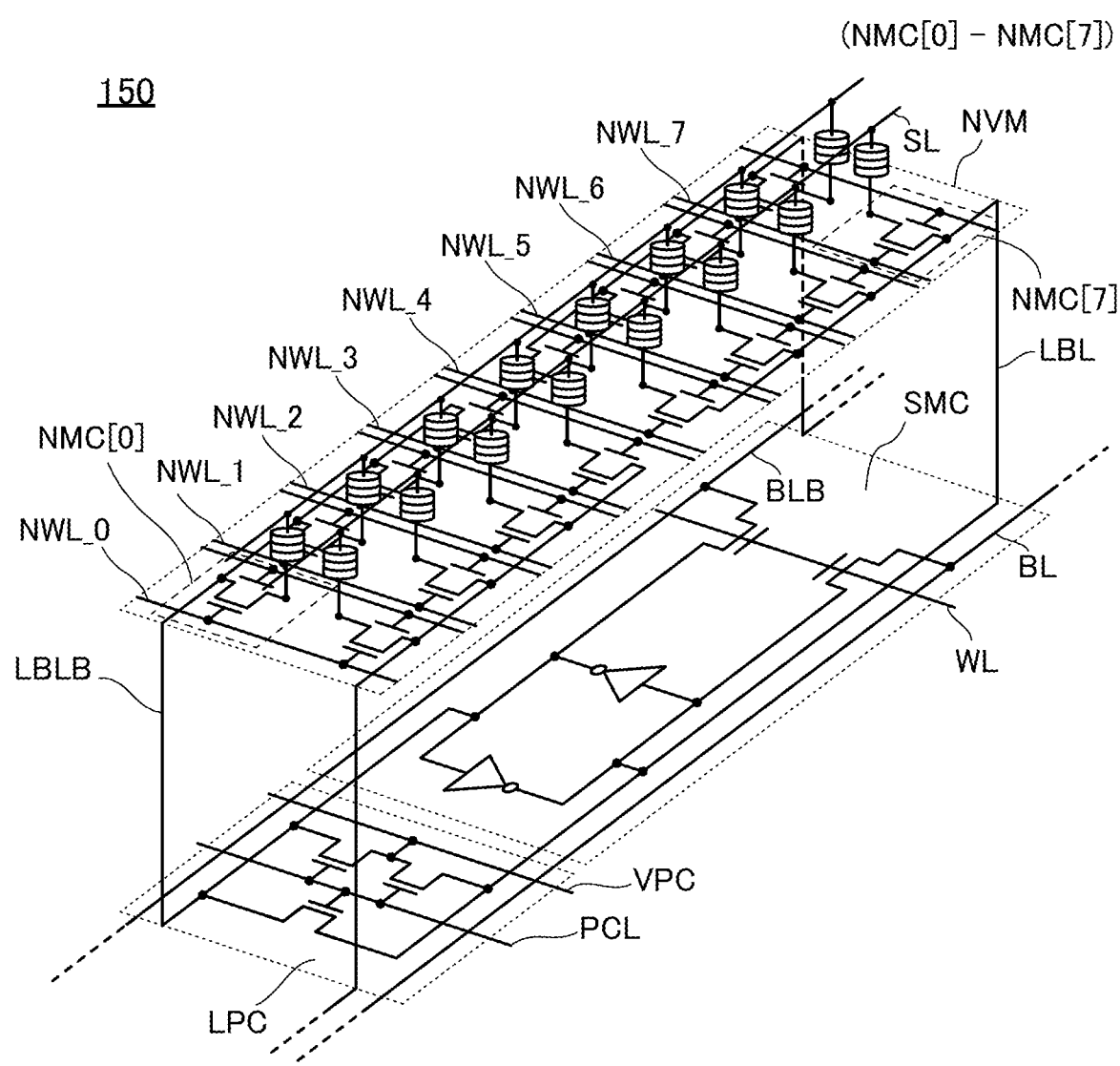
FIG. 11 A circuit diagram for describing a structure example of a storage device.
Figure 12:
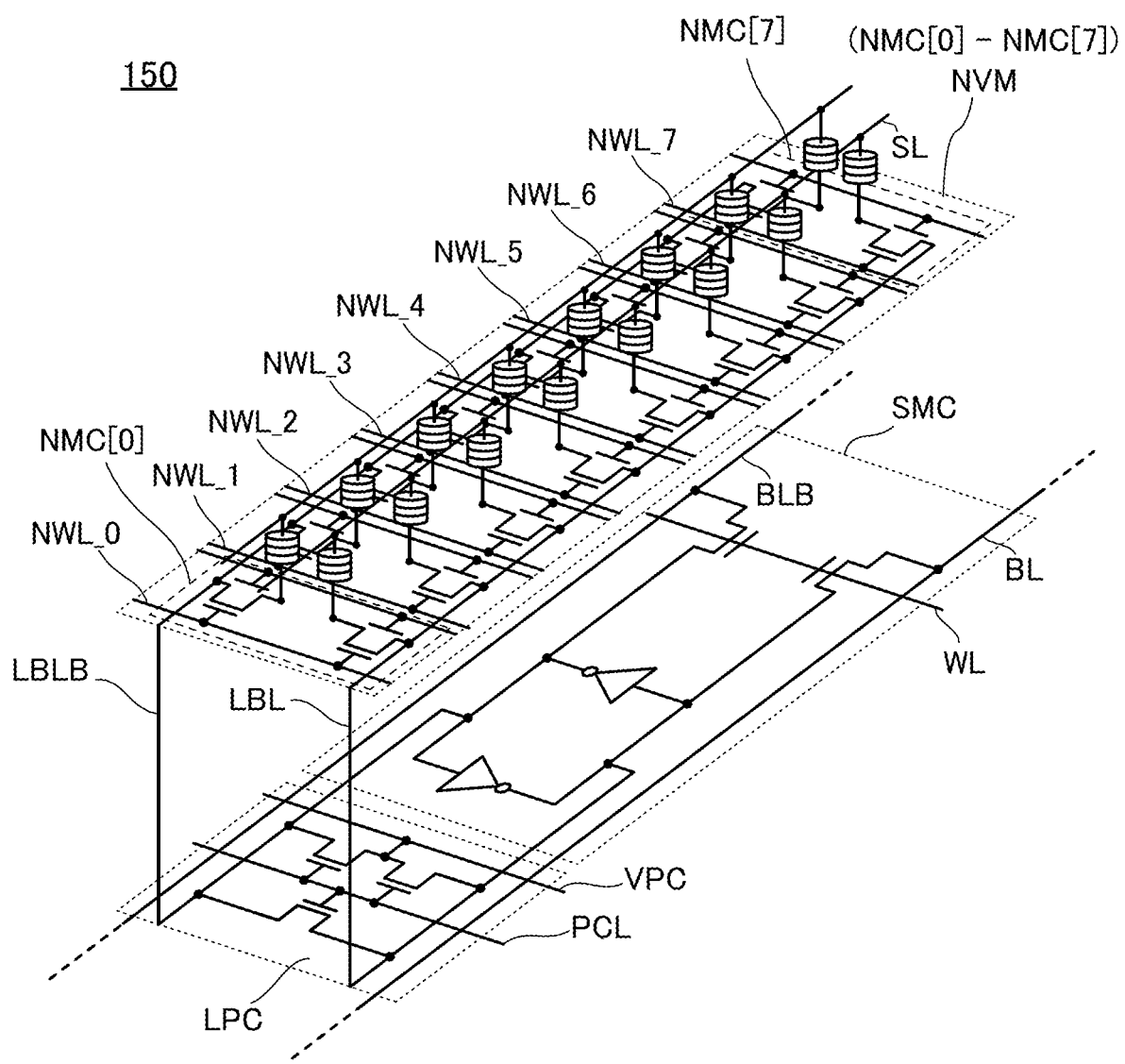
FIG. 12 A circuit diagram for describing a structure example of a storage device.

Next, the layout of the NVM (a folded architecture, a twin cell architecture, and an open-type architecture) is described using FIG. 10 to FIG. 12. Note that FIG. 10 to FIG. 12 show examples of the NVM that stores 8-bit data (the NVM includes the memory circuit NMC[0] to the memory circuit NMC[7]).

A circuit diagram illustrated in FIG. 10 shows an example in which a folded architecture is used as the layout of the memory cell 150. The memory circuit NMC[0] to the memory circuit NMC[7] are provided over a region where the SMC and the LPC are formed. In the memory cell 150 with the folded architecture, the memory circuits NMC are classified as those connected to the wiring LBL and those connected to the wiring LBLB. With the use of the folded architecture for the memory cell 150, noise that is output to the wiring LBL or the wiring LBLB by a change in the potential of the wiring NWL can be reduced.

A circuit diagram illustrated in FIG. 11 shows an example in which an open-type architecture is used as the layout of the memory cell 150. As in the case of the folded architecture, the memory circuit NMC is composed of one transistor and one MTJ device. In the memory cell 150 with the open-type architecture, the memory circuits NMC are classified as those connected to the wiring LBL and those connected to the wiring LBLB. In FIG. 11, two memory circuits NMC appear to be connected to one wiring NWL, but one of the two memory circuits NMC is connected to an adjacent memory cell 150. With the open-type architecture, the memory circuits NMC can be highly integrated, and the capacity of data that the storage device 100B can store be increased compared with the other layouts.

A circuit diagram shown in FIG. 12 shows an example in which a twin cell architecture is used as the layout of the memory cell 150. In FIG. 12, the memory circuit NMC is composed of two transistors and two capacitors. That is, the memory circuit NMC includes two complementary memory cells. In the memory cell 150 with a twin cell architecture, complementary data retained in two memory cells is used as 1-bit data.

The memory circuit NMC can hold complementary data for a long time by having a pair of memory cells. Since the complementary data is retained in the memory circuit NMC, the circuit SMC can function as a differential amplifier circuit when reading the complementary data retained in the memory circuit NMC. Thus, with a twin cell architecture, a highly reliable read operation can be performed even when the voltage difference between the voltage retained in one of the pair of memory cells and the voltage retained in the other of the pair of memory cells is small.

Figure 13:
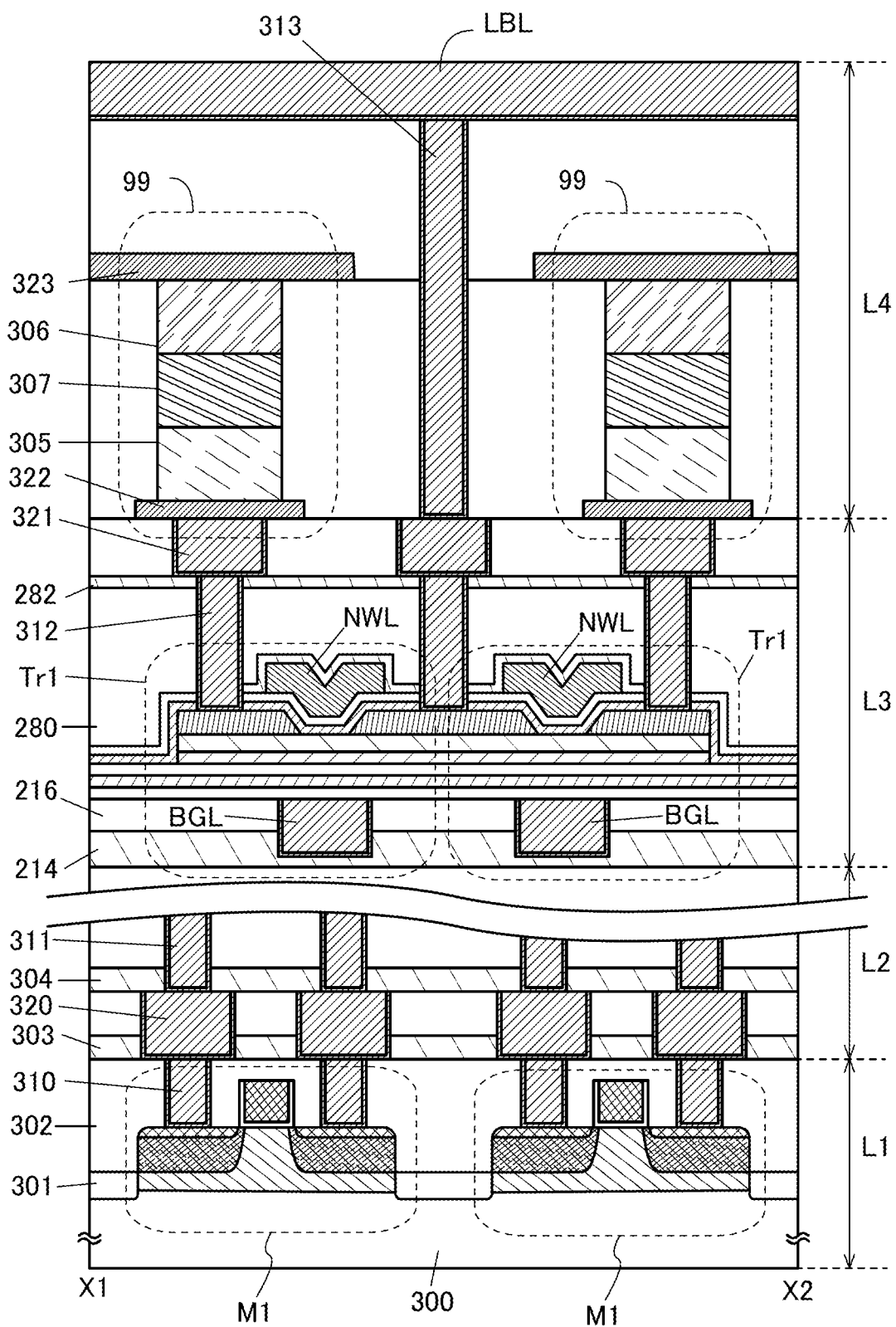
FIG. 13 A cross-sectional view for describing a structure example of a storage device.

FIG. 13 illustrates an example of a cross-sectional view of the storage device 100B. The storage device 100B illustrated in FIG. 13 includes a layer L1, a layer L2, a layer L3, and a layer L4 stacked in this order from the bottom. Note that by stacking two or more layers L2 and layers L3 between the layer L3 and the layer L4, a multilayer structure made of more layers can be obtained.

The layer L1 includes a transistor M1, a substrate 300, an element isolation layer 301, an insulator 302, a plug 310, and the like.

The layer L2 includes an insulator 303, a wiring 320, an insulator 304, a plug 311, and the like.

The layer L3 includes an insulator 214, an insulator 216, the transistor Tr1, an insulator 280, a plug 312, an insulator 282, a wiring 321, and the like. The first gate of the transistor Tr1 has a function of the wiring NWL, and the second gate of the transistor Tr1 has a function of the wiring BGL. FIG. 13 illustrates an example in which an OS transistor is used as the transistor Tr1.

The layer L4 includes the MTJ device 99, a plug 313, the wiring LBL, and the like. The MTJ device 99 is formed of a conductor 322, a conductor 323, an unfixed layer 305, a fixed layer 306, and an insulating layer 307.

The transistor M1 is provided over the substrate 300 and isolated from another adjacent transistor by the element isolation layer 301. For the element isolation layer 301, silicon oxide, silicon oxynitride, silicon nitride oxide, silicon nitride, or the like can be used. Note that in this specification, an oxynitride refers to a compound in which the oxygen content is higher than the nitrogen content, and a nitride oxide refers to a compound that contains more nitrogen than oxygen.

As the substrate 300, a single crystal semiconductor substrate or a polycrystalline semiconductor substrate of silicon or silicon carbide, a compound semiconductor substrate of silicon germanium, an SOI (Silicon On Insulator) substrate, or the like can be used. Moreover, a glass substrate, a quartz substrate, a plastic substrate, a metal substrate, an attachment film, paper containing a fibrous material, or a base film, for example, may be used as the substrate 300. After a semiconductor element is formed using one substrate, the semiconductor element may be transferred to another substrate.

Furthermore, a flexible substrate may be used as the substrate 300. Note that as a method for providing a transistor over a flexible substrate, there is also a method in which a transistor is formed over a non-flexible substrate, then separated from the non-flexible substrate and transferred to the substrate 300 that is a flexible substrate. In that case, a separation layer is preferably provided between the non-flexible substrate and the transistor. Note that as the substrate 300, a sheet, a film, a foil or the like that contains a fiber may be used. The substrate 300 may have elasticity. Furthermore, the substrate 300 may have a property of returning to its original shape when bending or pulling is stopped. Alternatively, the substrate may have a property of not returning to its original shape. The thickness of the substrate 300 is, for example, larger than or equal to 5 μm and smaller than or equal to 700 μm, preferably larger than or equal to 10 μm and smaller than or equal to 500 μm, further preferably larger than or equal to 15 μm and smaller than or equal to 300 μm. When the substrate 300 is made thinner, the weight of a semiconductor device can be reduced. Moreover, when the substrate 300 is made thinner, even in the case of using glass or the like, the substrate 300 may have elasticity or a property of returning to its original shape when bending or pulling is stopped. Thus, an impact applied to a semiconductor device over the substrate 300, which is caused by dropping or the like, can be reduced. That is, a durable semiconductor device can be provided. For the substrate 300 that is a flexible substrate, a metal, an alloy, resin, glass, or fiber thereof can be used, for example. The substrate 300 that is a flexible substrate preferably has a lower coefficient of linear expansion because deformation due to an environment is suppressed. For the substrate 300 that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (e.g., nylon, aramid, or the like), polyimide, polycarbonate, acrylic resin, and polytetrafluoroethylene (PTFE). In particular, aramid is suitable for the substrate 300 that is a flexible substrate because of its low coefficient of linear expansion.

This embodiment illustrates an example in which a single crystal silicon wafer is used as the substrate 300.

The transistor M1 includes a channel formation region and an impurity region provided in a well, a conductive region provided in contact with the impurity region, a gate insulator provided over the channel formation region, and a gate electrode provided over the gate insulator. The transistor M1 can be a FIN-type transistor.

This embodiment shows an example in which a Si transistor is used as the transistor M1. The transistor M1 may be either an n-channel transistor or a p-channel transistor; a transistor appropriate for an intended circuit is used.

The insulator 302 serves as an interlayer insulator. In the case where a Si transistor is used as the transistor M1, the insulator 302 preferably contains hydrogen. Hydrogen contained in the insulator 302 has an effect of terminating dangling bonds of silicon and thus improving the reliability of the transistor M1. For the insulator 302, silicon oxide, silicon oxynitride, silicon nitride oxide, silicon nitride, or the like is preferably used.

For the insulator 303, it is preferable to use a barrier film that prevents hydrogen or impurities from diffusing from the substrate 300, the transistor M1, or the like into a region where the transistor Tr1 is provided. For example, silicon nitride formed by a CVD method can be used. Diffusion of hydrogen into a metal oxide included in the transistor Tr1 degrades the characteristics of the metal oxide in some cases. Therefore, a film that inhibits hydrogen diffusion is preferably used between the transistor M1 and the transistor Tr1.

The film that inhibits hydrogen diffusion refers to a film that releases little amount of hydrogen. The amount of released hydrogen can be measured by thermal desorption spectroscopy (TDS), for example. For example, the amount of hydrogen released from the insulator 303 that is converted into hydrogen atoms per area of the insulator 303 in the TDS analysis in a film surface temperature range of 50° C. to 500° C. is lower than or equal to $10\times10^{15}$ atoms/cm², preferably lower than or equal to $5\times10^{15}$ atoms/cm².

For the insulators 304, 214, and 282, an insulator that inhibits copper diffusion or has barrier properties against oxygen and hydrogen is preferably used. For a film that inhibits copper diffusion, silicon nitride can be used, for example. Alternatively, a metal oxide such as aluminum oxide may be used.

For the insulator 216, a silicon oxide film or a silicon oxynitride film can be used, for example.

The details of the insulator 280 and the transistor Tr1 will be described in Embodiment 3 below.

For the insulating layer 307, magnesium oxide (MgO), aluminum oxide ($Al_2O_3$), or the like is used. For the unfixed layer 305 and the fixed layer 306, a ferromagnetic material such as iron (Fe) or cobalt (Co), or an alloy thereof is used. The unfixed layer 305, the fixed layer 306, and the insulating layer 307 can be formed with a single layer or a plurality of layers. Note that the unfixed layer 305, the fixed layer 306, and the insulating layer 307 may include an insulator or the like on their sidewall to facilitate processing.

The conductors, wirings, and plugs illustrated in FIG. 13 are preferably a single layer or a stacked layer of a conductor containing a single low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr); an alloy thereof, or a compound containing such a material as its main component. It is particularly preferable to use a material with a high melting point that has both heat resistance and conductivity, such as tungsten or molybdenum. Moreover, it is preferable to use a low-resistance conductive material such as aluminum or copper for formation of the conductors, wirings, and plugs.

In FIG. 13, regions without reference numerals or hatch patterns are formed of an insulator. As the insulator, it is possible to use an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Furthermore, for these regions, an organic resin such as a polyimide resin, a polyamide resin, an acrylic resin, a siloxane resin, an epoxy resin, or a phenol resin can be used.

The structure, composition, method, and the like described above in this embodiment can be used in appropriate combination with the structures, compositions, methods, and the like described in the other embodiments.

Embodiment 3

In this embodiment, a structure of the OS transistor used in the above embodiments will be described.

Figure 14A:
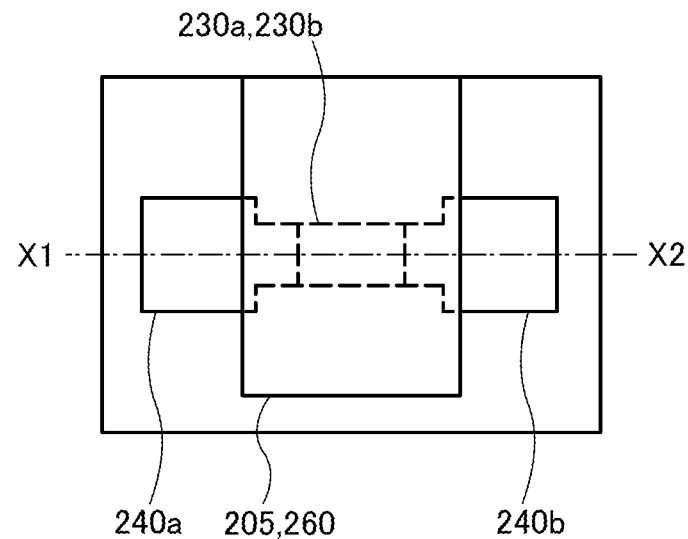
FIGS. 14A and 14B A top view and a cross-sectional view for describing a structure example of a transistor.
Figure 14B:
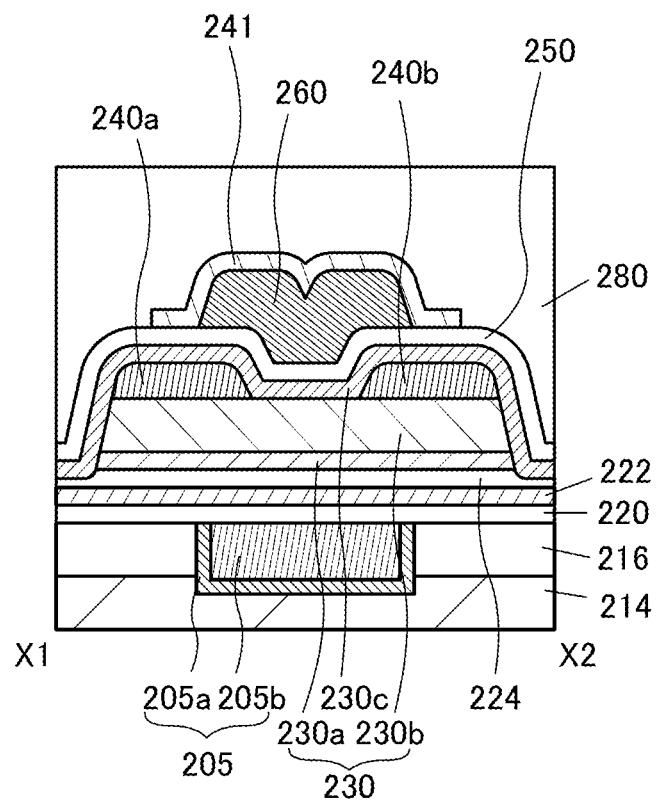

FIG. 14(A) and FIG. 14(B) are a top view and a cross-sectional view of a transistor 200a. FIG. 14(A) is a top view, and FIG. 14(B) is a cross-sectional view corresponding to the dashed-dotted line X1-X2 shown in FIG. 14(A). Note that for clarification of the drawing, some components are not illustrated in the top view in FIG. 14(A).

FIG. 14(B) illustrates an example in which the transistor 200a is provided over the insulator 214 and the insulator 216.

The transistor 200a includes a conductor 205 (a conductor 205a and a conductor 205b) and a conductor 260 that function as gate electrodes, an insulator 220, an insulator 222, an insulator 224, and an insulator 250 that function as gate insulators, a metal oxide 230 (a metal oxide 230a, a metal oxide 230b, and a metal oxide 230c), a conductor 240a that functions as one of a source or a drain, a conductor 240b that functions as the other of the source or the drain, an insulator 241 that protects the conductor 260, and the insulator 280 that contains excess oxygen (contains oxygen in excess of that in the stoichiometric composition).

In the transistor 200a, the conductor 260 is referred to as a top gate and the conductor 205 is referred to as a bottom gate in some cases. Alternatively, the conductor 260 is referred to as a first gate and the conductor 205 is referred to as a second gate in some cases.

The metal oxide 230 includes the metal oxide 230a, the metal oxide 230b over the metal oxide 230a, and the metal oxide 230c over the metal oxide 230b. When the transistor 200a is turned on, current flows mainly in the metal oxide 230b. The metal oxide 230b has a function of a channel formation region. Meanwhile, although current sometimes flows through the vicinity of the interface (a mixed region in some cases) between the metal oxide 230b and each of the metal oxide 230a and the metal oxide 230c, the other regions sometimes function as insulators.

The energy level of the conduction band minimum of the metal oxide 230a and the metal oxide 230c is closer to the vacuum level than that of the metal oxide 230b. Typically, a difference between the energy level of the conduction band minimum of the metal oxide 230b and the energy level of the conduction band minimum of the metal oxide 230a and the metal oxide 230c is preferably larger than or equal to 0.15 eV or larger than or equal to 0.5 eV, and lower than or equal to 2 eV or lower than or equal to 1 eV. That is, a difference between the electron affinity of the metal oxide 230b and the electron affinity of the metal oxide 230a and the metal oxide 230c is preferably larger than or equal to 0.15 eV or larger than or equal to 0.5 eV, and lower than or equal to 2 eV or lower than or equal to 1 eV.

The energy gap of the metal oxide 230b is preferably larger than or equal to 2 eV, further preferably larger than or equal to 2.5 eV and smaller than or equal to 3.0 eV. In addition, the energy gap of the metal oxide 230a and the metal oxide 230c is preferably larger than or equal to 2 eV, further preferably larger than or equal to 2.5 eV, still further preferably larger than or equal to 2.7 eV and smaller than or equal to 3.5 eV. Moreover, the energy gap of the metal oxide 230a and the metal oxide 230c is preferably larger than the energy gap of the metal oxide 230b. For example, compared with the energy gap of the metal oxide 230b, the energy gap of the metal oxide 230a and the metal oxide 230c is preferably larger than or equal to 0.15 eV, larger than or equal to 0.5 eV, or larger than or equal to 1.0 eV and smaller than or equal to 2 eV, or smaller than or equal to 1 eV.

The thicknesses of the metal oxide 230a, the metal oxide 230b, and the metal oxide 230c are larger than or equal to 3 nm and smaller than or equal to 200 nm, preferably larger than or equal to 3 nm and smaller than or equal to 100 nm, further preferably larger than or equal to 3 nm and smaller than or equal to 60 nm.

Decreasing the carrier density of a metal oxide is preferable because the negative shift of the threshold voltage of the transistor can be suppressed, or the off-state current of the transistor can be reduced. Factors affecting the carrier density of a metal oxide include oxygen vacancy (Vo) and impurities in the metal oxide. As the amount of oxygen vacancies in the metal oxide increases, the density of defect states increases when hydrogen is bonded to the oxygen vacancies (this state is also referred to as VoH). Moreover, with an increase of impurities in the metal oxide, the density of defect states due to the impurities increases. Hence, the carrier density of a metal oxide can be controlled by controlling the density of defect states in the metal oxide.

For example, the carrier density of the metal oxide 230a and the metal oxide 230c is lower than $8 \times 10^{15}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$.

The carrier density of a metal oxide is preferably increased when the object is to improve the on-state current or field-effect mobility of a transistor. In order to increase the carrier density of a metal oxide, the impurity concentration of the metal oxide is slightly increased, or the band gap of the metal oxide is narrowed.

The carrier density of the metal oxide 230b is preferably higher than those of the metal oxide 230a and the metal oxide 230c.

The density of defect states in a mixed layer formed at an interface between the metal oxide 230a and the metal oxide 230b or an interface between the metal oxide 230b and the metal oxide 230c is preferably decreased. Specifically, when the metal oxide 230a and the metal oxide 230b or the metal oxide 230b and the metal oxide 230c contain the same element (as a main component) other than oxygen, a mixed layer with a low density of defect states can be formed. For example, in the case where the metal oxide 230b is In—Ga—Zn oxide, for the metal oxide 230a and the metal oxide 230c, In—Ga—Zn oxide, Ga—Zn oxide, gallium oxide, or the like is preferably used.

At this time, the metal oxide 230b serves as a main carrier path. Since the density of defect states at the interface between the metal oxide 230a and the metal oxide 230b and the interface between the metal oxide 230b and the metal oxide 230c can be decreased, the influence of interface scattering on carrier conduction is small, and a high on-state current can be obtained.

A material whose conductivity is sufficiently low compared with the metal oxide 230b is preferably used for the metal oxide 230a and the metal oxide 230c. For example, a metal oxide with an atomic ratio that increases insulation is used for the metal oxide 230a and the metal oxide 230c. Note that the atomic ratios that increase insulation are [In]:[M]:[Zn]=0:1:0 and a neighborhood value thereof, [In]:[M]:[Zn]=1:3:2 and a neighborhood value thereof, and [In]:[M]:[Zn]=1:3:4 and a neighborhood value thereof.

In particular, in the case where a metal oxide with any of the above-mentioned atomic ratios is used as the metal oxide 230b, a metal oxide with [M]/[In] of larger than or equal to 1, preferably larger than or equal to 2 is used for the metal oxide 230a and the metal oxide 230c. In addition, as the metal oxide 230c, it is suitable to use a metal oxide with [M]/([Zn]+[In]) of larger than or equal to 1 that can obtain sufficiently high insulation.

The conductor 205 is a metal film containing an element selected from molybdenum, titanium, tantalum, tungsten, aluminum, copper, chromium, neodymium, and scandium; a metal nitride film containing the above elements as its component (e.g., a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable to use a conductor with a barrier property against hydrogen, such as tantalum nitride, as the conductor 205a and to stack tungsten, which has high conductivity, as the conductor 205b. The use of the combination can prevent diffusion of hydrogen into the metal oxide 230 while retaining the conductivity of a wiring. Note that a two-layer structure of the conductor 205a and the conductor 205b is shown in FIG. 14(B); however, the structure is not limited thereto and may be a single-layer structure or a stacked-layer structure of three or more layers.

The insulator 220 and the insulator 224 are preferably insulators that contain oxygen, such as a silicon oxide film or a silicon oxynitride film. In particular, an insulator containing excess oxygen is preferably used as the insulator 224. When such an insulator containing excess oxygen is provided in contact with the metal oxide constituting the transistor 200a, oxygen vacancies in the metal oxide can be compensated for. Note that the insulator 222 and the insulator 224 do not need to be formed using the same material.

A single layer or a stacked layer of an insulator containing what is called a high-k material such as silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST), for example, is preferably used for the insulator 222. Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

Note that the insulator 222 may have a stacked-layer structure of two or more layers. In that case, without limitation to a stacked-layer structure formed of the same material, a stacked-layer structure formed of different materials may be employed.

The threshold voltage can be controlled by appropriately adjusting the thicknesses of the insulator 220, the insulator 222, and the insulator 224. Alternatively, a transistor with a low leakage current when in a non-conductive state can be provided. Each of the thicknesses of the insulator 220, the insulator 222, and the insulator 224 is preferably reduced to facilitate control of threshold voltage by the conductor 205. For example, each of the thicknesses of the insulator 220, the insulator 222, and the insulator 224 is less than or equal to 50 nm, further preferably less than or equal to 30 nm, further preferably less than or equal to 10 nm, and still further preferably less than or equal to 5 nm.

For the insulator 250, an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used in a single layer or a stacked layer. Alternatively, aluminum oxide, bismuth oxide, germanium oxide, niobium oxide, silicon oxide, titanium oxide, tungsten oxide, yttrium oxide, or zirconium oxide, for example, may be added to these insulators. Alternatively, these insulators may be subjected to nitriding treatment. Silicon oxide, silicon oxynitride, or silicon nitride may be stacked over the above-mentioned insulators.

In addition, as the insulator 250, it is preferable to use an oxide insulator that contains more oxygen than that which satisfies the stoichiometric composition, as in the case of the insulator 224. When such an insulator containing excess oxygen is provided in contact with the metal oxide 230, the amount of oxygen vacancies in the metal oxide 230 can be reduced.

Furthermore, as the insulator 250, it is possible to use an insulating film with barrier properties against oxygen and hydrogen, such as aluminum oxide, aluminum oxynitride, hafnium oxide, hafnium oxynitride, or silicon nitride. When formed using such a material, the insulator 250 functions as a layer that prevents release of oxygen from the metal oxide 230 and entry of an impurity such as hydrogen from the outside.

A metal such as aluminum, titanium, chromium, nickel, copper, yttrium, zirconium, molybdenum, silver, tantalum, or tungsten or an alloy containing any of the metals as its main component can be used for the conductors 240a and 240b. Although a single-layer structure is shown in the drawing, a stacked-layer structure of two or more layers may be employed.

For example, a titanium film and an aluminum film may be stacked. Furthermore, a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film further formed thereover; and a three-layer structure consisting of a molybdenum film or a molybdenum nitride film, an aluminum film or a copper film stacked over the molybdenum film or the molybdenum nitride film, and a molybdenum film or a molybdenum nitride film further formed thereover; or the like may be employed. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten; an alloy containing any of the above metals as its component; or an alloy containing any of the above metals in combination. Furthermore, one or more metals selected from manganese and zirconium may be used. Alternatively, a semiconductor typified by polycrystalline silicon doped with an impurity element such as phosphorus, or silicide such as nickel silicide may be used.

For example, a two-layer structure where a titanium film is stacked over aluminum may be employed. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Another example is a three-layer structure consisting of a titanium film, an aluminum film stacked over the titanium film, and a titanium film further stacked thereover. Alternatively, an alloy film or a nitride film in which aluminum is combined with one or more metals selected from titanium, tantalum, tungsten, molybdenum, chromium, neodymium, and scandium may be used.

Alternatively, for the conductor 260, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used. Alternatively, a stacked-layer structure of the above light-transmitting conductive material and the above metal may be employed.

By using a conductive material with a high work function for the conductor 260, the threshold voltage of the transistor 200a can be increased and the cutoff current can be reduced. A conductive material whose work function is preferably 4.8 eV or higher, further preferably 5.0 eV or higher, further preferably 5.2 eV or higher, further preferably 5.4 eV or higher, further preferably 5.6 eV or higher is used for the conductor 260. Examples of a conductive material with a high work function include molybdenum, molybdenum oxide, platinum (Pt), Pt silicide, nickel silicide, indium tin oxide, and an In—Ga—Zn oxide to which nitrogen is added.

The insulator 241 is provided to cover the conductor 260. As the insulator 241, it is possible to use an insulating film with barrier properties against oxygen and hydrogen, such as aluminum oxide, aluminum oxynitride, hafnium oxide, hafnium oxynitride, or silicon nitride. Formation using any of these materials can prevent oxidation of the conductor 260 by heat treatment process. Note that the insulator 241 can be omitted when a material that is difficult to oxidize is used as the conductor 260.

The insulator 280 is provided above the transistor 200a. The insulator 280 preferably contains excess oxygen. In particular, by providing an insulator containing excess oxygen as an interlayer film at the vicinity of the transistor 200a to reduce the amount of oxygen vacancies in the transistor 200a, reliability can be improved.

As the insulator containing excess oxygen, specifically, an oxide material from which part of oxygen is released by heating is preferably used. An oxide that releases oxygen by heating is an oxide film in which the amount of released oxygen converted into oxygen atoms is larger than or equal to $1.0 \times 10^{18}$ atoms/cm$^3$, preferably larger than or equal to $3.0 \times 10^{20}$ atoms/cm$^3$ in TDS analysis. Note that the temperature of the film surface in the TDS analysis is preferably in a range higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

Furthermore, the insulator 280 covering the transistor 200a may function as a planarization film that covers an uneven shape thereunder.

Figure 15A:
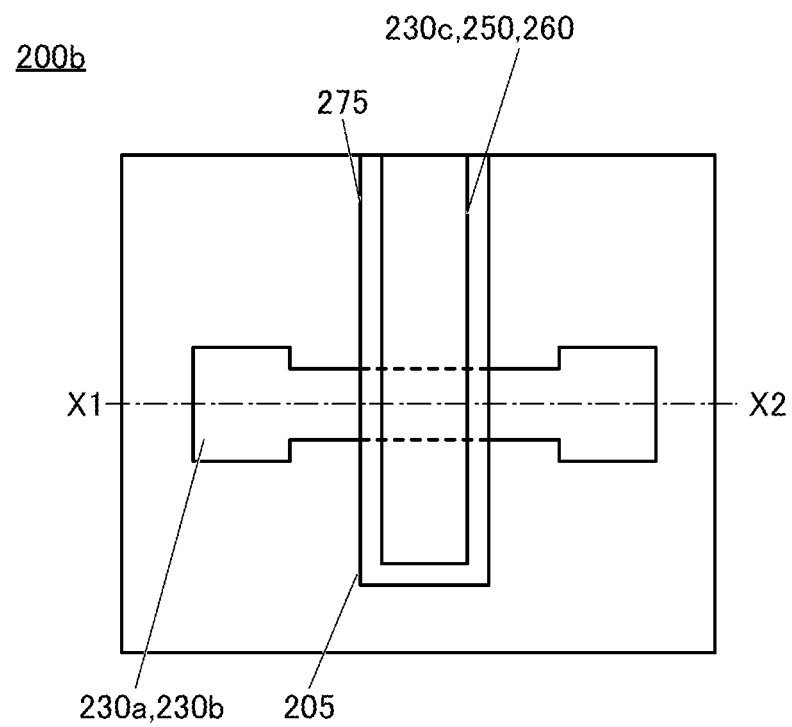
FIGS. 15A and 15B A top view and a cross-sectional view for describing a structure example of a transistor.
Figure 15B:
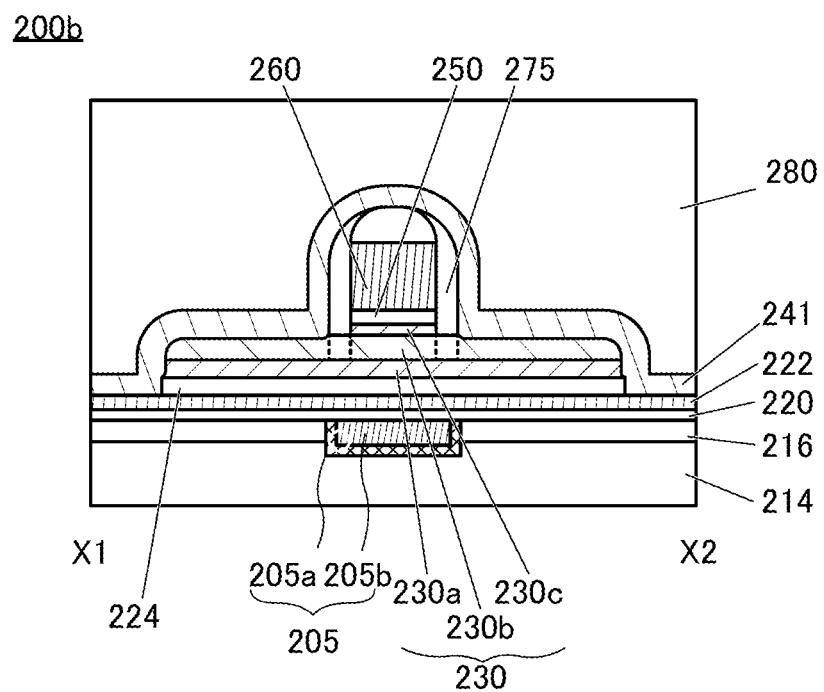

FIG. 15(A) and FIG. 15(B) are a top view and a cross-sectional view of a transistor 200b that has a structure different from that of the transistor 200a. FIG. 15(A) is a top view, and FIG. 15(B) is a cross-sectional view corresponding to the dashed-dotted line X1-X2 shown in FIG. 15(A). Note that for clarification of the drawing, some components are not illustrated in the top view in FIG. 15(A).

The transistor 200b in FIG. 15(A) and FIG. 15(B) is a modification example of the transistor 200a in FIGS. 14(A) and 14(B). The transistor 200b includes an insulator 275 positioned to be in contact with the side surfaces of the insulator 250, the metal oxide 230c, and the conductor 260.

Figure 16A:
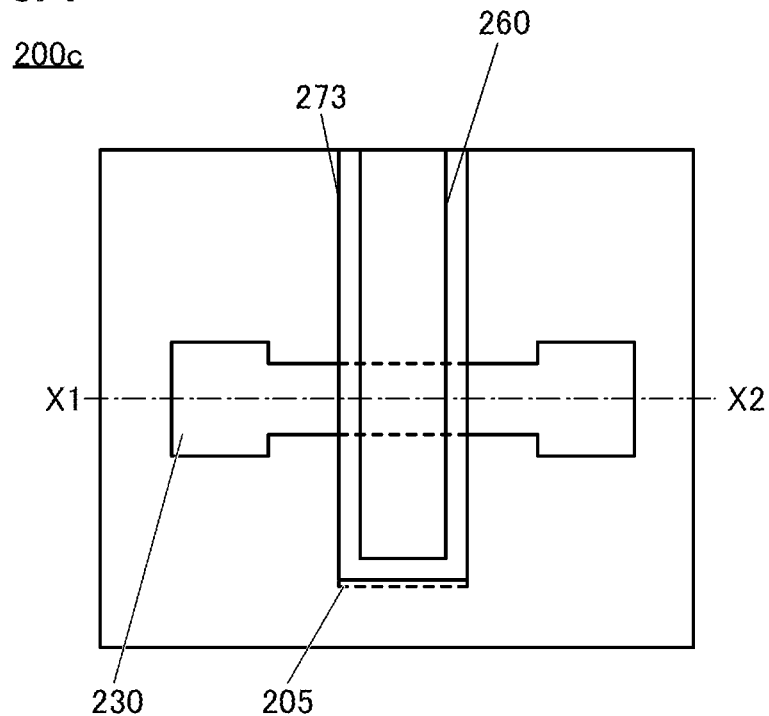
FIGS. 16A and 16B A top view and a cross-sectional view for describing a structure example of a transistor.
Figure 16B:
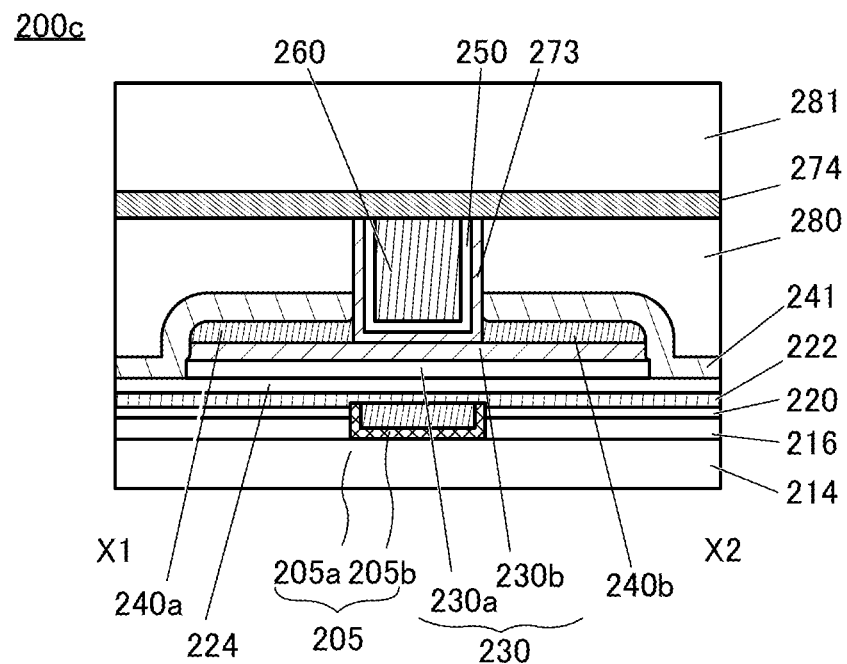

FIG. 16(A) and FIG. 16(B) are a top view and a cross-sectional view of a transistor 200c that has a structure different from those of the transistors 200a and 200b. FIG. 16(A) is a top view, and FIG. 16(B) is a cross-sectional view corresponding to the dashed-dotted line X1-X2 shown in FIG. 16(A). Note that for clarification of the drawing, some components are not illustrated in the top view of FIG. 16(A).

The transistor 200c in FIG. 16(A) and FIG. 16(B) is a modification example of the transistor 200a in FIGS. 14(A) and 14(B). The transistor 200c illustrates a structure in which an opening is provided in a region where the conductor 260 in the insulator 280 is provided, and an insulator 273, the insulator 250, and the conductor 260 are embedded in the opening sequentially. An insulator 274 and an insulator 281 are provided over the insulator 280, the insulator 273, the insulator 250, and the conductor 260. In employing such a structure, a transistor that allows microfabrication can be obtained.

Figure 17A:
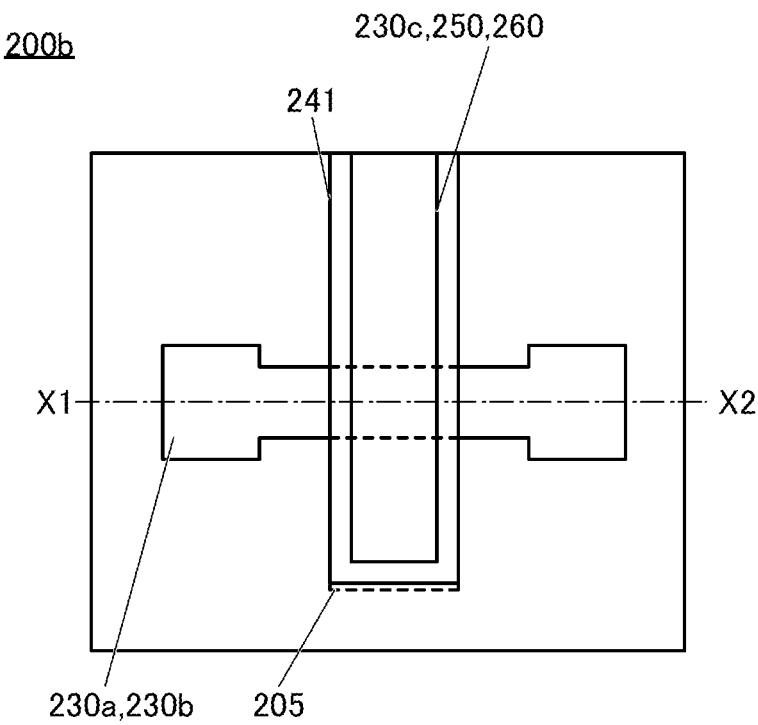
FIGS. 17A and 17B A top view and a cross-sectional view for describing a structure example of a transistor.
Figure 17B:
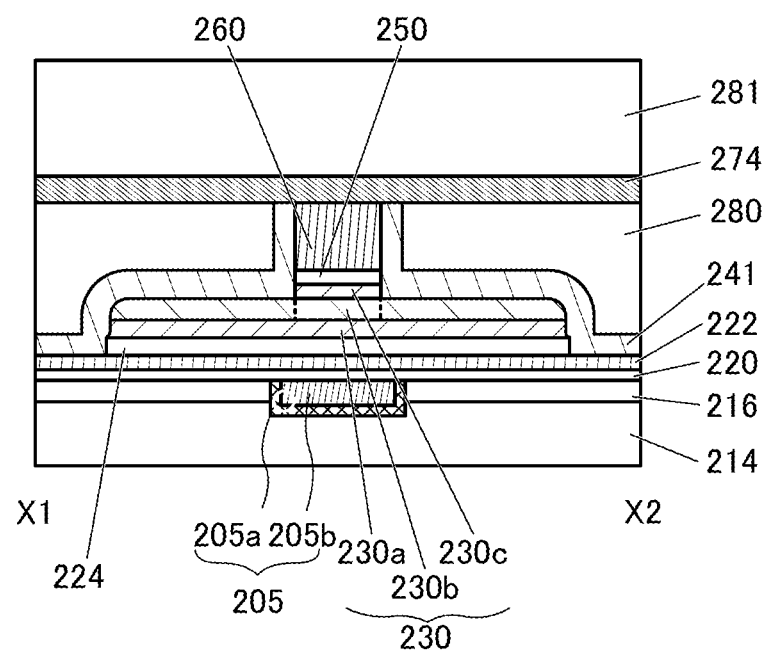

FIG. 17(A) and FIG. 17(B) are a top view and a cross-sectional view of a transistor 200d that has a structure different from those of the transistors 200a, 200b, and 200c. FIG. 17(A) is a top view, and FIG. 17(B) is a cross-sectional view corresponding to the dashed-dotted line X1-X2 shown in FIG. 17(A). Note that for clarification of the drawing, some components are not illustrated in the top view of FIG. 17(A).

The transistor 200d in FIG. 17(A) and FIG. 17(B) is a modification example of the transistor 200a in FIGS. 14(A) and 14(B). For the transistor 200d, a structure is illustrated in which a dummy structure is provided in a region where the conductor 260 is provided in the insulator 280, and the metal oxide 230c, the insulator 250, and the conductor 260 are embedded sequentially in the opening provided after removing the dummy structure. The insulator 274 and the insulator 281 are provided over the insulator 280, the insulator 241, and the conductor 260. In employing such a structure, a transistor that allows microfabrication can be obtained.

The structure, composition, method, and the like described above in this embodiment can be used in appropriate combination with the structures, compositions, methods, and the like described in the other embodiments.

Embodiment 4

In this embodiment, examples of electronic components and electronic devices that include the storage devices described in the above embodiments will be described.

First, an example of an electronic component including the storage device will be described using FIG. 18.

Figure 18:
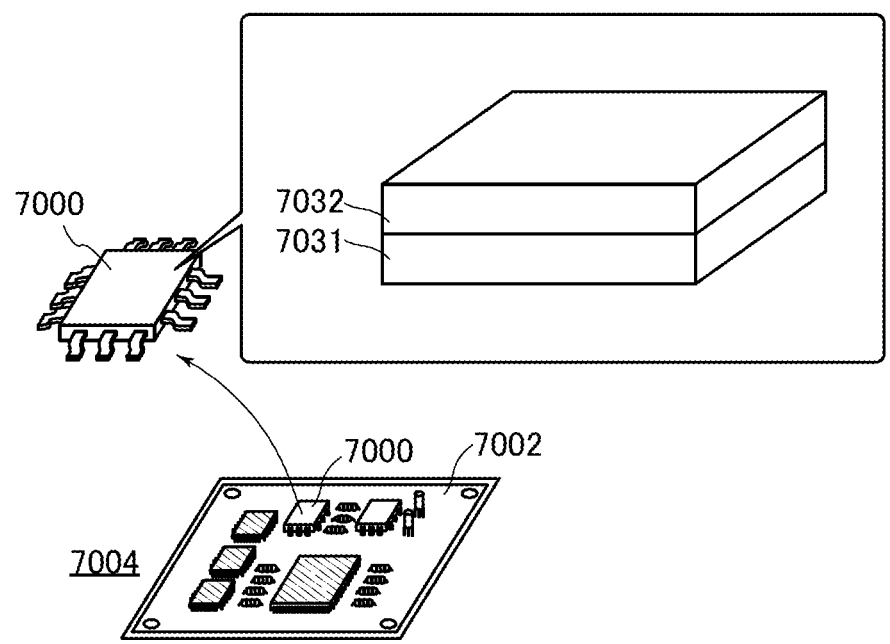
FIG. 18 A schematic diagram illustrating an example of an electronic component.

An electronic component 7000 illustrated in FIG. 18 is an IC chip and includes a lead and a circuit portion. The electronic component 7000 is mounted on a printed circuit board 7002, for example. A plurality of such IC chips are combined and electrically connected to each other on the printed circuit board 7002; thus, a board on which electronic components are mounted (a mounting board 7004) is completed.

The circuit portion of the electronic component 7000 is formed of a stack of a substrate 7031 and a layer 7032.

A material that can be used for a substrate where Si transistors are formed and is described in the above embodiment is used for the substrate 7031. In the case where a semiconductor substrate of silicon or the like is used as the substrate 7031, an integrated circuit may be formed on the substrate 7031, and the layer 7032 including an OS transistor may be formed thereover.

The layer 7032 includes the OS transistor described in the above embodiment. For example, the storage device 100A or 100B described in the above embodiment can be provided over the substrate 7031 and the layer 7032.

An OS transistor can be provided by being stacked over other semiconductor devices, and thus the electronic component 7000 can be reduced in size.

As described in the above embodiment, a device such as an MTJ device can be provided over the layer 7032 in the electronic component 7000.

Although a QFP (Quad Flat Package) is used as a package of the electronic component 7000 in FIG. 18, the embodiment of the package is not limited thereto.

Figure 19A:
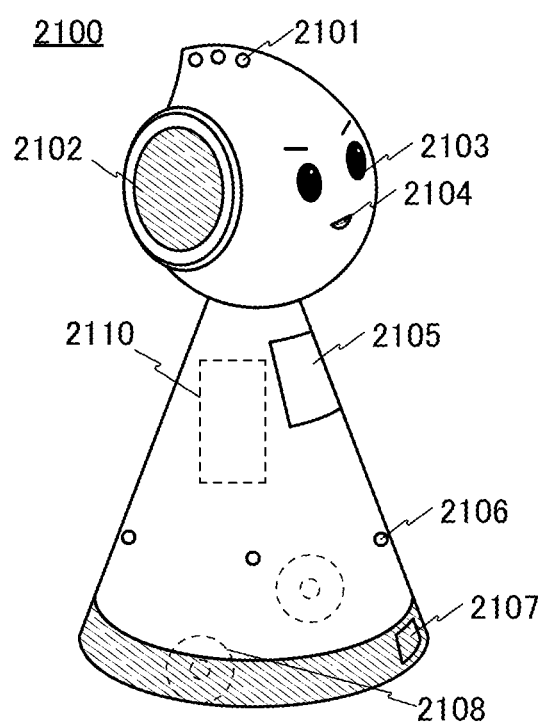
FIGS. 19A to 19E Schematic diagrams illustrating examples of electronic devices.
Figure 19B:
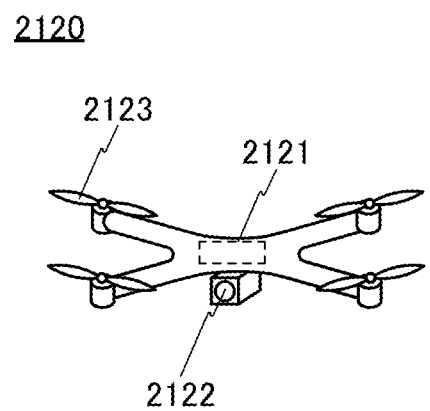
Figure 19C:
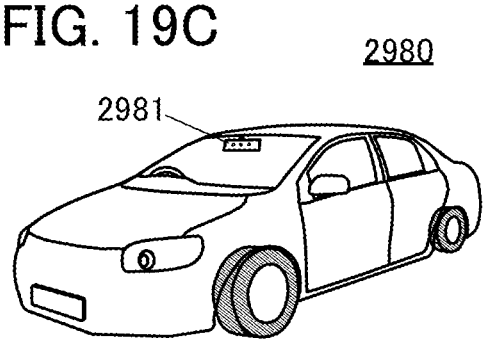
Figure 19D:
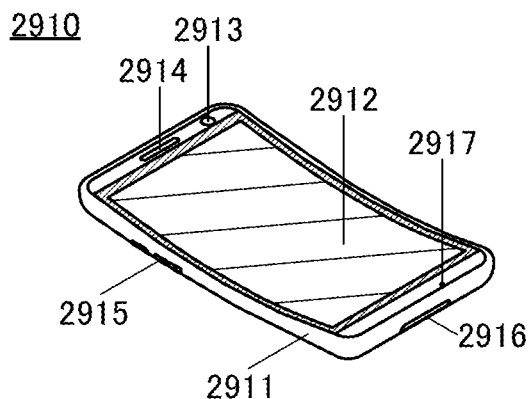
Figure 19E:
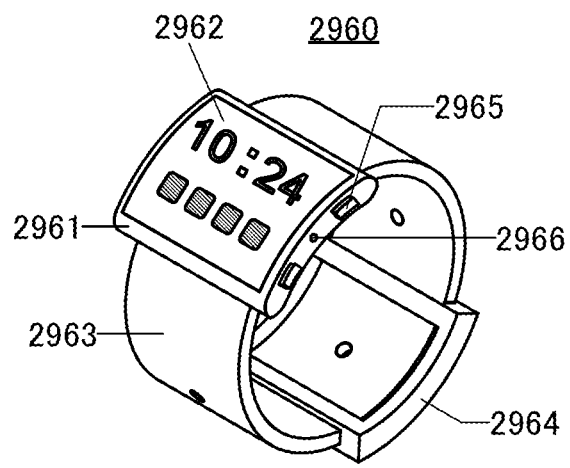
Figure 20:
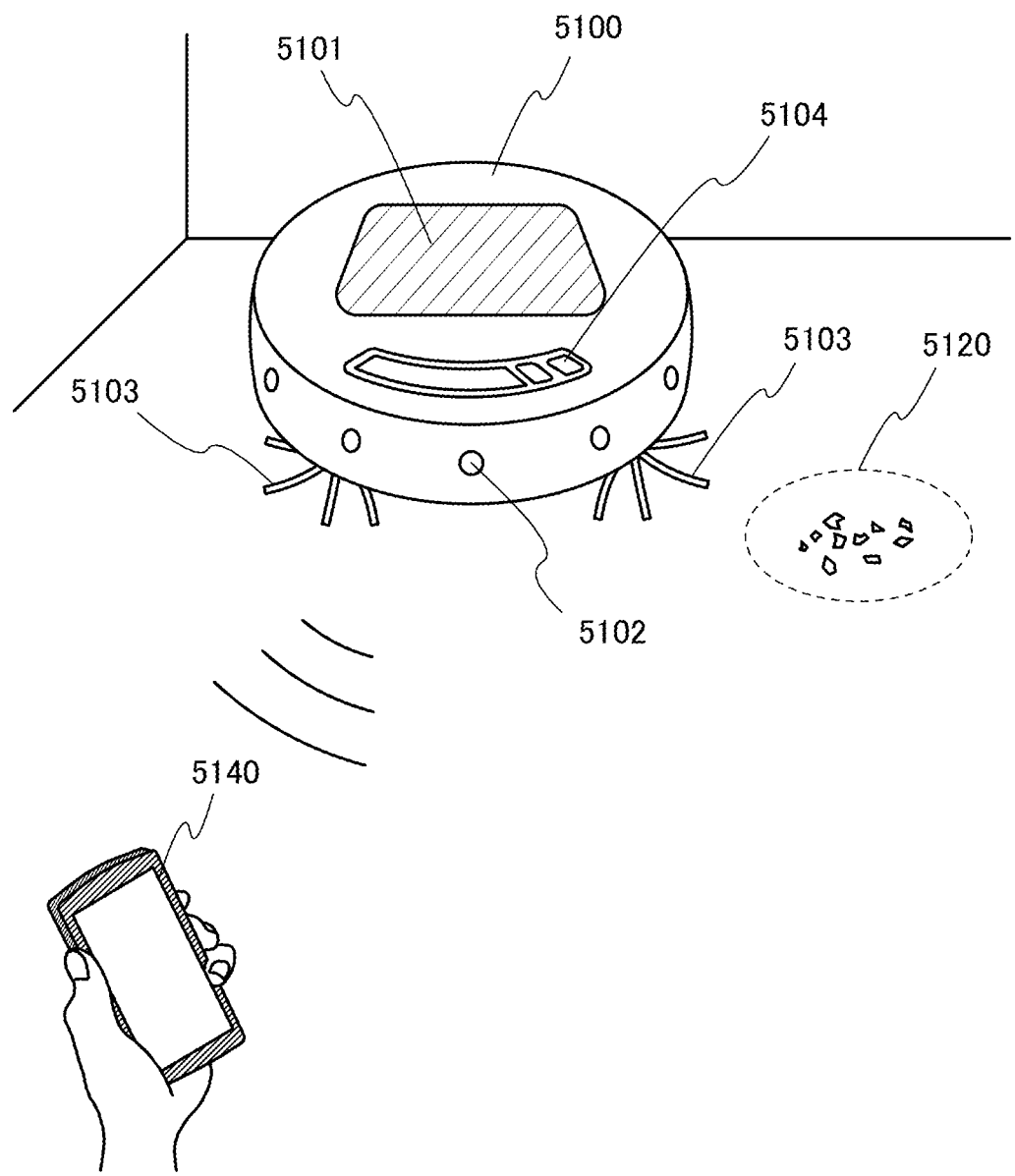
FIG. 20 A schematic diagram illustrating an example of an electronic device.

Next, examples of electronic devices including the above electronic component are described using FIG. 19 and FIG. 20.

A robot 2100 illustrated in FIG. 19(A) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The above electronic component can be used for the arithmetic device 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107.

A flying object 2120 illustrated in FIG. 19(B) includes an arithmetic device 2121, a propeller 2123, and a camera 2122, and has a function of flying autonomously.

The above electronic component can be used in the arithmetic device 2121 and the camera 2122 of the flying object 2120.

FIG. 19(C) is an external view illustrating an example of an automobile. An automobile 2980 includes a camera 2981 and the like. The automobile 2980 also includes various sensors such as an infrared radar, a millimeter wave radar, and a laser radar. The automobile 2980 can perform automatic driving while analyzing images taken by the camera 2981 and determining surrounding traffic situation such as the presence of a pedestrian.

In the automobile 2980, the electronic component described above can be used for the camera 2981.

An information terminal 2910 illustrated in FIG. 19(D) includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader. The above electronic component can be used for a storage device and the camera 2913 inside the information terminal 2910.

FIG. 19(E) illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, viewing and composing texts, music reproduction, Internet communication, and computer games. The above electronic component can be used for a storage device inside the information terminal 2960.

FIG. 20 is a schematic view illustrating an example of a cleaning robot.

A cleaning robot 5100 includes a display 5101 placed on its top surface, a plurality of cameras 5102 placed on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The above electronic component can be used for the cameras 5102.

The cleaning robot 5100 is self-propelled, detects dust 5120, and can suck up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation button 5104 may be provided on the display 5101.

The cleaning robot 5100 can communicate with a portable electronic apparatus 5140 such as a smartphone. The portable electronic apparatus 5140 can display images taken by the cameras 5102. Accordingly, an owner of the cleaning robot 5100 can monitor the room even from the outside.

The description of the terms and the like described in the embodiments are added below.

Unless otherwise specified, on-state current in this specification refers to drain current of a transistor in an on state. Unless otherwise specified, the on state (abbreviated as on in some case) of an n-channel transistor means that the voltage (VG) between its gate and source is higher than or equal to the threshold voltage (Vth), and the on state of a p-channel transistor means that VG is lower than or equal to Vth. For example, the on-state current of an n-channel transistor refers to drain current when VG is higher than or equal to Vth. Furthermore, the on-state current of a transistor depends on voltage between a drain and a source (VD) in some cases.

Unless otherwise specified, off-state current in this specification refers to a drain current of a transistor in an off state. Unless otherwise specified, the off state (abbreviated as off in some cases) of an n-channel transistor means that VG is lower than Vth, and the off state of a p-channel transistor means that VG is higher than Vth. For example, the off-state current of an n-channel transistor refers to drain current when VG is lower than Vth. The off-state current of a transistor depends on VG in some cases. Thus, an off-state current of a transistor that is lower than $10^{-21}$ A would in some cases refer to VG at which the off-state current of the transistor is lower than $10^{-21}$ A.

The off-state current of a transistor depends on VD in some cases. Unless otherwise specified, the off-state current in this specification may refer to off-state current at VD with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may refer to off-state current at VD used in a semiconductor device or the like including the transistor.

In this specification and the like, voltage and potential can be interchanged as appropriate. The voltage refers to a potential difference from a reference potential. When the reference potential is a ground potential, for example, the voltage can be expressed as the potential. The ground potential does not necessarily mean 0 V. Potentials are relative values, and the potential applied to a wiring or the like is changed depending on the reference potential, in some cases.

In this specification and the like, when there is a description which explicitly states that X and Y are connected, the case where X and Y are electrically connected and the case where X and Y are directly connected are regarded as being disclosed in this specification and the like.

Here, X and Y each denote an object (e.g., a device, an element, a circuit, a wiring, an electrode, a terminal, a conductive film, or a layer).

An example of the case where X and Y are directly connected to each other is the case where X and Y are connected to each other without an element that enables an electrical connection between X and Y (e.g., a switch, a transistor, a capacitor, an inductor, a resistor, a diode, a display element, a light-emitting element, or a load).

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has the function of controlling whether current flows or not by being in a conduction state (an on state) or a non-conduction state (an off state). Alternatively, the switch has a function of selecting and changing a current path. Note that the case where X and Y are electrically connected includes the case where X and Y are directly connected.

REFERENCE NUMERALS

100: storage device, 101: circuit block, 102: control circuit, 103: PSW, 104: row circuit, 105: column circuit, 106: PSW, 110: memory cell array, 111: row decoder, 113: row driver, 114: column decoder, 115: column driver, 116: input/output circuit, 120: MCSA array, 130: block, 131: sense amplifier block, 132: sense amplifier, 135: local cell array

The invention claimed is:
1. A storage device comprising:
a memory cell comprising a first transistor and a first magnetic tunnel junction device; and
a sense amplifier circuit,
wherein the first transistor comprises:
a first channel formation region comprising an oxide semiconductor;
a gate electrode overlapping with the oxide semiconductor; and
a gate insulator between the first channel formation region and the gate electrode,
wherein the first channel formation region is electrically connected to the first magnetic tunnel junction device through a plug,
wherein the plug overlaps with the first transistor and the first magnetic tunnel junction device, wherein the sense amplifier circuit comprises a second transistor, and wherein a second channel formation region of the second transistor comprises silicon.

2. The storage device according to claim 1, wherein the first magnetic tunnel junction device is stacked over the first transistor with the plug therebetween.

3. A storage device comprising:

a memory cell comprising a first transistor and a first magnetic tunnel junction device, wherein the first transistor comprises:

a first channel formation region comprising an oxide semiconductor;

a gate electrode overlapping with the oxide semiconductor; and a gate insulator between the first channel formation region and the gate electrode, wherein the first channel formation region is electrically connected to the first magnetic tunnel junction device through a plug, wherein the plug overlaps with the first transistor and the first magnetic tunnel junction device, and wherein the oxide semiconductor comprises indium.

4. The storage device according to claim 3, wherein the first magnetic tunnel junction device is stacked over the first transistor with the plug therebetween.

* * * * *